US007236114B2

(12) United States Patent
Ahn

(10) Patent No.: US 7,236,114 B2
(45) Date of Patent: Jun. 26, 2007

(54) DIGITAL-TO-ANALOG CONVERTERS INCLUDING FULL-TYPE AND FRACTIONAL DECODERS, AND SOURCE DRIVERS FOR DISPLAY PANELS INCLUDING THE SAME

(75) Inventor: Jeong-Ah Ahn, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 21 days.

(21) Appl. No.: 11/299,041

(22) Filed: Dec. 9, 2005

(65) Prior Publication Data

US 2006/0125761 A1 Jun. 15, 2006

(30) Foreign Application Priority Data

Dec. 13, 2004 (KR) ...................... 10-2004-0105009

(51) Int. Cl.
*H03M 1/66* (2006.01)
*G09G 3/36* (2006.01)

(52) U.S. Cl. ...................... 341/144; 341/145; 341/118; 345/87; 345/89

(58) Field of Classification Search ................ 341/144, 341/145, 118; 345/87, 89, 100, 103
See application file for complete search history.

(56) References Cited

U.S. PATENT DOCUMENTS 5,617,111 A 4/1997 Saitoh
6,424,281 B1 * 7/2002 Liaw et al. ................. 341/144
6,593,934 B1 * 7/2003 Liaw et al. ................. 345/590
6,747,626 B2 * 6/2004 Chiang ........................ 345/98
6,781,535 B2 * 8/2004 Lee ............................ 341/144
6,950,045 B2 * 9/2005 Kim ........................... 341/118
7,167,117 B2 * 1/2007 Choe .......................... 341/120
2002/0063666 A1 * 5/2002 Kang et al. ................... 345/87
2002/0163324 A1 * 11/2002 Lee ............................ 323/364
2005/0156851 A1 * 7/2005 Yun ............................ 345/98

FOREIGN PATENT DOCUMENTS

JP 10-143116 5/1998
JP 2000-137459 5/2000
KR 1020000046786 A 7/2000

* cited by examiner

*Primary Examiner*—Linh V. Nguyen
(74) *Attorney, Agent, or Firm*—Myers Bigel Sibley & Sajovec PA

(57) ABSTRACT

A digital-to-analog converter includes a full-type decoder, a fractional decoder and an averaging amplifier. The full-type decoder is configured to select, based on N-bit digital data, one of a set of first gamma reference voltages corresponding to a first interval of gamma reference voltages. The fractional decoder is configured to receive a set of second gamma reference voltages corresponding to a second interval of gamma reference voltages, and is configured to generate, based on the N-bit digital data, a plurality of output voltages including one of a pair of adjacent gamma reference voltages in the set of second gamma reference voltages. The averaging amplifier is configured to output an average of the plurality of output voltages of the fractional decoder. A source driver for a display panel includes a digital-to-analog converter as described.

39 Claims, 14 Drawing Sheets

FIG. 3
(PRIOR ART)

| GRAY SCALE | DIGITAL DATA | OUTPUT OF THE VOLTAGE SELECTING UNIT | | OUTPUT OF THE AVERAGE AMPLIFIER |
|---|---|---|---|---|
| | D9D8D7D6D5D4D3D2D1 | Y1 | Y2 | Ya |
| 0 | 0000000000 | V0 | V0 | V0 |
| 1 | 0000000001 | V0 | V2 | V1 |
| 2 | 0000000010 | V2 | V2 | V2 |
| 3 | 0000000011 | V2 | V4 | V3 |
| 4 | 0000000100 | V4 | V4 | V4 |
| 5 | 0000000101 | V4 | V6 | V5 |
| 6 | 0000000110 | V6 | V6 | V6 |
| 7 | 0000000111 | V6 | V8 | V7 |
| ⋮ | ⋮ | ⋮ | ⋮ | ⋮ |

FIG. 5
(PRIOR ART)

| GRAY SCALE | DIGITAL DATA | OUTPUT OF THE VOLTAGE SELECTING UNIT | | | | OUTPUT OF THE AVERAGE AMPLIFIER |
|---|---|---|---|---|---|---|
| | D9D8D7D6D5D4D3D2D1 | Y1 | Y2 | Y3 | Y4 | Ya |
| 0 | 0000000000 | V0 | V0 | V0 | V0 | V0 |
| 1 | 0000000001 | V0 | V0 | V0 | V4 | V1 |
| 2 | 0000000010 | V0 | V0 | V4 | V4 | V2 |
| 3 | 0000000011 | V0 | V4 | V4 | V4 | V3 |
| 4 | 0000000100 | V4 | V4 | V4 | V4 | V4 |
| 5 | 0000000101 | V4 | V4 | V4 | V8 | V5 |
| 6 | 0000000110 | V4 | V4 | V8 | V8 | V6 |
| 7 | 0000000111 | V4 | V8 | V8 | V8 | V7 |
| 8 | 0000001000 | V8 | V8 | V8 | V8 | V8 |
| 9 | 0000001001 | V8 | V8 | V8 | V12 | V9 |
| ⋮ | ⋮ | ⋮ | ⋮ | | | ⋮ |

FIG. 11

| GRAY SCALE | D9D8D7D6D5D4D3 | D2D1D0 | Y1Y2Y3Y4 | Ya | Yout1 | Yout2 | Yout |
|---|---|---|---|---|---|---|---|
| 0 | 0000000 | 000 | - | - | V0 | - | V0 |
| 1 | 0000000 | 001 | - | - | V1 | - | V1 |
| 2 | 0000000 | 010 | - | - | V2 | - | V2 |
| 3 | 0000000 | 011 | - | - | V3 | - | V3 |
| 4 | 0000000 | 100 | - | - | V4 | - | V4 |
| 5 | 0000000 | 101 | - | - | V5 | - | V5 |
| 6 | 0000000 | 110 | - | - | V6 | - | V6 |
| 7 | 0000000 | 111 | - | - | V7 | - | V7 |
| 8 | 0000001 | 000 | V8V8V8V8 | V8 | - | - | V8 |
| 9 | 0000001 | 001 | V8V8V8V12 | V9 | - | - | V9 |
| 10 | 0000001 | 010 | V8V8V12V12 | V10 | - | - | V10 |
| ⋮ | ⋮ | ⋮ | ⋮ | ⋮ | ⋮ | ⋮ | ⋮ |
| 1016 | 1111111 | 000 | - | - | - | V1016 | V1016 |
| ⋮ | ⋮ | ⋮ | ⋮ | ⋮ | ⋮ | ⋮ | ⋮ |
| 1023 | 1111111 | 111 | - | - | - | V1023 | V1023 |

FIG. 13

| GRAY SCALE | D9D8D7D6D5D4D3 | D2D1D0 | X1 | X2 | X3 | X4 | Ya |
|---|---|---|---|---|---|---|---|
| 0 | 0000000 | 000 | V0 | V0 | V0 | V0 | V0 |
| 1 | 0000000 | 001 | V1 | V1 | V1 | V1 | V1 |
| 2 | 0000000 | 010 | V2 | V2 | V2 | V2 | V2 |
| 3 | 0000000 | 011 | V3 | V3 | V3 | V3 | V3 |
| 4 | 0000000 | 100 | V4 | V4 | V4 | V4 | V4 |
| 5 | 0000000 | 101 | V5 | V5 | V5 | V5 | V5 |
| 6 | 0000000 | 110 | V6 | V6 | V6 | V6 | V6 |
| 7 | 0000000 | 111 | V7 | V7 | V7 | V7 | V7 |
| 8 | 0000001 | 000 | V8 | V8 | V8 | V8 | V8 |
| 9 | 0000001 | 001 | V8 | V8 | V8 | V12 | V9 |
| 10 | 0000001 | 010 | V8 | V8 | V12 | V12 | V10 |
| ⋮ | ⋮ | ⋮ | ⋮ | | | | ⋮ |
| 1016 | 1111111 | 000 | V1016 | V1016 | V1016 | V1016 | V1016 |
| ⋮ | ⋮ | ⋮ | ⋮ | | | | ⋮ |
| 1023 | 1111111 | 111 | V1023 | V1023 | V1023 | V1023 | V1023 |

DIGITAL-TO-ANALOG CONVERTERS INCLUDING FULL-TYPE AND FRACTIONAL DECODERS, AND SOURCE DRIVERS FOR DISPLAY PANELS INCLUDING THE SAME

CLAIM FOR PRIORITY AND CROSS REFERENCE TO RELATED APPLICATION

This application claims priority under 35 USC § 119 to Korean Patent Application No. 10-2004-0105009, filed on Dec. 13, 2004, the disclosure of which is incorporated herein by reference in its entirety.

FIELD OF THE INVENTION

The present invention relates to digital-to-analog converters including decoders, and source drivers for display panels including the same.

BACKGROUND

Display devices are used in various types of electronic devices such as monitors, laptop computers, TVs and mobile communication terminals. For such devices, it is desirable for the display to be thin and/or light. To satisfy such requirements, various Flat Panel Displays (FPDs) have been developed as alternatives to more conventional cathode ray tube displays.

An LCD (Liquid Crystal Display) is one kind of Flat Panel Display. In an LCD, dielectric anisotropic liquid crystal is injected between an upper substrate's alignment layer having a common electrode and a lower substrate's alignment layer having a pixel electrode. An image is displayed by applying voltage into the common electrode and the pixel electrode to form an electric field between the common electrode and the pixel electrode, and then controlling intensity of the electric field to control transmittance of light of the liquid crystal.

RGB (Red, Green, Blue) data are input into the LCD from an external host system, e.g., a graphic source. The data format of the input RGB data is converted by a timing controller of the LCD, and transmitted to a source driver IC (Integrated Circuit). The source driver IC generates an analog gray scale voltage corresponding to the RGB data and supplies the analog signal to selected pixels of the LCD panel, to thereby cause the LCD panel to display an image.

Generally, the bit number of the RGB data input into the timing controller needs to be the same as that of the data signal of the source driver IC. In general, a color depth of 18-bits (i.e. each of the Red, Green and Blue data is 6 bits (n=6)), or 24-bits (i.e. each of the Red, Green and Blue is 8 bits (n=8)) is commonly used in LCDs.

As electrical devices including LCD displays have become bigger, a source driver IC capable of handling a data signal having more than 10 bits (n=10) so as to display a broader range of colors has been desired.

However, increasing the number of data bits of a source driver IC may be difficult and/or expensive. In particular, a digital-to-analog converter for converting input digital data to analog gray scale voltage is built in the source driver IC. Because the number of transistors included in a digital-to-analog converter increases greatly according as the number of data bits increases, the more the number of data bits is increased, the more the size of a conventional source driver IC chip must be increased.

FIG. 1 is a circuit diagram illustrating a conventional digital-to-analog converter having a full-type decoder.

As illustrated in FIG. 1, the digital-to-analog converter includes a gamma reference voltage generating circuit 10 which generates gamma reference voltages having a plurality of levels and a decoder 20 which receives 8-bit digital data to select one of the gamma reference voltages based on the 8-bit digital data.

The gamma reference voltage generating circuit 10 includes a plurality of resistor arrays connected in series between the GVDD and the VGS voltage levels, and generates 256 gamma reference voltages having 256 voltage levels using a voltage divider such as the resistor arrays.

Although not illustrated, the gamma reference voltage generating circuit 10 may include a gamma compensation circuit that can compensate for the gamma reference voltages so that the compensated gamma reference voltages may substantially conform to an ideal gamma curve.

The decoder 20 receives 8-bit digital data, i.e. bit values D0, D1, D2, D3, D4, D5, D6 and D7 and inverted values of each of the bit values, i.e. D0B, D1B, D2B, D3B, D4B, D5B, D6B and D7B, and selects one gamma reference voltage from among V0, V1, V2, . . . , V254, V255 gamma reference voltages generated by the gamma reference voltage generating unit 10 based on the value of the 8-bit digital data.

The decoder 20 includes 256 MOS transistor arrays 21 respectively corresponding to V0, V1, V2, . . . , V254, V255 gamma reference voltages generated from the gamma reference voltage generating unit 10. Each of the 256 MOS transistor arrays 21 includes eight MOS transistors connected in series, and each of the eight MOS transistors corresponds to a bit of input digital data. The corresponding bit values of the input digital data, or the inverted values, are input into the gate of each of the eight MOS transistors.

For example, in case where the input digital data are '0000001', a gamma reference voltage V1 will be output, because the gate of MOS transistor M0 is connected to D0, while all of the MOS transistors M1 through M7 are connected to the inverted signals D1B to D7B, respectively, in a second MOS transistor array 21 that is configured to select the gamma reference voltage V1. The output gamma reference voltage V1, i.e. an analog gray scale voltage, is amplified to have predetermined voltage level, and then, input into an LCD panel (not shown).

However, in cases where an 8-bit module decoder is implemented as a full-type decoder, 256 (i.e. $2^8$) MOS transistor arrays 21 are required in order to be able to select each of the 256 gamma reference voltages. As a result, a switching circuit may require a large number (8×256=2048) of MOS transistors. Therefore, it is difficult to miniaturize the chip size, and the circuit may consume excessive power.

Furthermore, configuring a decoder 20 for decoding 10-bit digital data requires 1024 MOS transistor arrays respectively having 10 MOS transistors in order to be able to select one of 1024 gamma reference voltages, so that 10×1024=10240 MOS transistors may be required. Thus, the number of the MOS transistors needed for a 10-bit decoder is increased more than 4 times compared with a decoder for decoding 8-bit digital data.

Consequently, such a full-type decoder selects one among the $2^n$ input gamma reference voltages to decode n-bit digital data, so that the full-type decoder can output accurate analog gray scale voltage. However, a full-type decoder may require a very large chip area in order to decode 10-bit digital data. In addition, a full-type decoder may consume a significant amount of power. Because the decoder may occupy almost 50 percent of the chip area in a source driver IC, when the size of the decoder increased, it may not be possible to minimize the chip size.

Because of these problems, fractional decoders such as a half-type decoder and a quarter-type decoder have been used. A fractional decoder outputs a number of analog gray scale voltages by using two gamma reference voltages generated from a gamma reference voltage generating unit. As will be explained in greater detail below, an averaging amplifier coupled to the fractional decoder generates a weighted average of the two gamma reference voltage to provide gamma reference voltages intermediate and/or equal to the two gamma reference voltages. The half-type decoder and the quarter-type decoder can reduce the number of MOS transistors to one half or one fourth, respectively, compared with the full-type decoder using all the $2^n$ gamma reference voltages.

FIG. 2 is a circuit diagram illustrating a conventional 10-bit standard half-type decoder used in a source driver IC.

As illustrated in FIG. 2, a half-type decoder 80 includes a gamma reference voltage selecting unit 40 and an averaging amplifier 50. The gamma reference voltage selecting unit 40 receives V0, V2, V4, V6, . . . from a gamma reference voltages generating unit, and receives 10-bit digital data, i.e. D0, D1, D2, D3, D4, D5, D6, D7, D8 and D9 bit value and the inverted values of each bit value, i.e. D0B, D1B, D2B, D3B, D4B, D5B, D6B, D7B, D8B and D9B, for selecting the gamma reference voltage, and outputs two gamma reference voltages Y1 and Y2. The averaging amplifier 50 receives two gamma reference voltages output from the gamma reference voltage selecting unit 40, and outputs an average voltage of the two.

FIG. 3 is a table illustrating functioning of half-type decoder 80 illustrated on FIG. 2.

Referring to FIG. 2 and FIG. 3, the half-type decoder 80 selects and outputs two gamma reference voltages Y1 and Y2, by using a predetermined gamma reference voltage and a gamma reference voltage 2 gray scale levels higher than the predetermined gamma reference voltage, and then, outputs an average voltage Ya of the two gamma reference voltages Y1 and Y2.

For example, in case where the input digital data are '0000000000', because the gamma reference voltage selecting unit 40 selects V0 and outputs V0 as both Y1 and Y2, an average value V0 is output through the averaging amplifier 50.

In addition, in case where the input digital data are '0000000001', because the gamma reference voltage selecting unit 40 selects V0 and V2 and outputs V0 and V2 as Y1 and Y2, respectively, an average value V1 of V0 and V2 is output through the averaging amplifier 50 as output Ya. In addition, in case where the input digital data are '0000000010', because the gamma reference voltage selecting unit 40 selects and outputs V2 and V2 as Y1 and Y2, respectively, an average value Ya of V2 is output by the averaging amplifier 50.

In this manner, the half-type decoder 80 can choose all of the analog gray scale voltages to be input to a LCD panel by using only 512 gamma reference voltages among 1024 gamma reference voltages. Therefore, because the number of the MOS transistor arrays for selecting each of the gamma reference voltages can be greatly reduced, the area of the chip and the dissipated power can be reduced by almost one half compared with the full-type decoder.

FIG. 4 is a circuit diagram illustrating a conventional 10-bit standard quarter-type decoder used in a source driver IC.

As illustrated in FIG. 4, a quarter-type decoder 90 includes a gamma reference voltage selecting unit 60 and an averaging amplifier 70. The gamma reference voltage selecting unit 60 receives the gamma reference voltages, i.e. V0, V4, V8, V12, . . . from the gamma reference voltages generating unit 10, and receives 10-bit digital data, i.e. bit values D0, D1, D2, D3, D4, D5, D6, D7, D8 and D9 and inverted values of each of the bit values, i.e. D0B, D1B, D2B, D3B, D4B, D5B, D6B, D7B, D8B and D9B for selecting and outputting one of the gamma reference voltages, and outputs four gamma reference voltages Y1–Y4. The averaging amplifier 70 receives four gamma reference voltages Y1–Y4 output from the gamma reference voltage selecting unit 60, and outputs an average voltage Ya.

FIG. 5 is a table illustrating the operation of a quarter-type decoder 90 illustrated in FIG. 4.

Referring to FIG. 5, the half-type decoder 90 selects and outputs four gamma reference voltages, i.e. Y1, Y2, Y3 and Y4 by using a given gamma reference voltage and a gamma reference voltage 4 gray scale levels higher than the given gamma reference voltage, and then, outputs average voltage Ya of Y1, Y2, Y3 and Y4.

For example, in case where the input digital data are '0000000000', because the gamma reference voltage selecting unit 60 selects and outputs V0, V0, V0 and V0 as Y1–Y4, an average value V0 is output as Ya by the averaging amplifier 70.

In addition, in case where the input digital data are '0000000001', because the gamma reference voltage selecting unit 60 selects V0, V0, V0 and V4 and outputs V0, V0, V0 and V4 as Y1–Y4, an average value V1 is output as Ya by the averaging amplifier 70. In addition, in case where the input digital data are '0000000010', because the gamma reference voltage selecting unit 60 selects V0, V0, V4 and V4 and outputs V0, V0, V4 and V4 as Y1–Y4, Ya equals V2 when average value is output through the averaging amplifier 70.

In case where the input digital data are '0000000011', because the gamma reference voltage selecting unit 60 selects V0, V4, V4 and V4 and outputs V0, V4, V4 and V4 as Y1–Y4, Ya equals V3 when the average value is output by the averaging amplifier 70. In addition, in case where the input digital data are '0000000100', because the gamma reference voltage selecting unit 60 selects V4, V4, V4 and V4 and outputs V4, V4, V4 and V4 as Y1–Y4, Ya equals V4 when an average value is output by the averaging amplifier 70.

In this manner, the quarter-type decoder 90 can generate 1024 analog gray scale voltages to be input to an LCD panel by using only 256 gamma reference voltages. Therefore, because the number of MOS transistor arrays for selecting each of the gamma reference voltages can be greatly reduced, the area of the chip and the dissipated power can be reduced compared with a full-type decoder and/or a half-type decoder.

However, while such a half-type decoder and/or a quarter-type decoder can reduce the area of a chip used for the source driver IC and/or the power dissipation thereof, it may be difficult to output accurate analog gray scale voltage because the gamma reference voltage input to the decoder may not be linear over the entire range of gamma reference voltages.

FIG. 6 is a graph illustrating a gamma curve of gamma reference voltage. The y-axis represents brightness and the x-axis represents gamma reference voltage.

Referring to FIG. 6, because the gamma reference voltage is nonlinear in certain regions, such as in the vicinity of the beginning section V0~V7 and in the vicinity of the last section V1016~V023, and because, in the nonlinear intervals (a, c), the average voltage of 2 (or 4) gamma reference voltages selected by a given gamma reference voltage and a gamma reference voltage 2 gray scale levels (or 4 gray scale levels) higher than the given gamma reference voltage may not be exactly equal to a gamma reference voltage located between the two gamma reference voltages (i.e. the given gamma reference voltage and a gamma reference voltage 2 gray scale levels higher than the given gamma reference voltage), accurate analog gray scale voltages may not be output. Consequently, a distortion of the gamma curve occurs, and the display quality may be deteriorated.

While a conventional full-type decoder can output a relatively accurate analog gray scale voltage, such a circuit may require a large chip area and/or may have a large power dissipation. Moreover, while a conventional half-type decoder or a conventional quarter-type decoder may require less chip area and may have reduced power dissipation, such circuits may not output accurate analog gray scale voltage levels in the nonlinear intervals (a, c) of the gamma reference voltage curve.

SUMMARY

Some embodiments of the present invention provide a digital-to-analog converter including a full-type decoder, a fractional decoder and an averaging amplifier. The full-type decoder is configured to select one of a set of first gamma reference voltages based on an N-bit digital data, the set of first gamma reference voltages corresponding to a first interval of a plurality of gamma reference voltages. The fractional decoder is configured to receive a set of second gamma reference voltages corresponding to a second interval of the plurality of gamma reference voltages, and is configured to generate a plurality of output voltages based on the N-bit digital data, each of the plurality of output voltages including one of a pair of adjacent gamma reference voltages in the set of second gamma reference voltages. The averaging amplifier is coupled to the fractional decoder and is configured to output an average of the plurality of output voltages of the fractional decoder.

The first interval may include a nonlinear interval of the plurality of gamma reference voltages, and the second interval may include a linear interval of the plurality of gamma reference voltages. In some embodiments of the invention, N equals 10, and the plurality of gamma reference voltages include 1024 levels for representing a 0th gray scale through a 1023rd gray scale.

The first gamma reference voltages may represent the 0th gray scale through the 7th gray scale, and the second gamma reference voltages may represent the 8th gray scale through the 1015th gray scale.

More generally, the first gamma reference voltages may represent a 0th gray scale through an (M×8−1)th gray scale, and the second gamma reference voltages represent the (M×8)th gray scale through a (P×8−1)th gray scale.

A digital-to-analog converter may further include a second full-type decoder configured to select one of a set of third gamma reference voltages based on the N-bit digital data, the set of third gamma reference voltages corresponding to a third interval of the plurality of gamma reference voltages. The third interval may include a nonlinear set of the plurality of gamma reference voltages.

The third gamma reference voltages represent the 1016th gray scale through the 1023rd gray scale.

The second set of gamma reference voltages may be combinations of Vn and Vn+k, where Vn may be one of the second set of gamma reference voltages and Vn+k may be a gamma reference voltage which may be k gray scale levels higher than Vn.

In some embodiments of the invention, k equals four and the average gamma reference voltage may be one gamma reference voltage among Vn, Vn+1, Vn+2 and Vn+3, with Vn+1 being 1 gray scale higher than Vn, Vn+2 being 2 gray scales higher than Vn, and Vn+3 being 3 gray scales higher than Vn.

The full-type decoder and the fractional decoder may receive each bit value of the N-bit digital data along with an inverted value of each of the bit values.

A digital-to-analog converter may further include a gamma reference voltage generating circuit coupled to the full-type decoder and the fractional decoder and configured to generate the plurality of gamma reference voltages for representing a plurality of gray scales.

A digital-to-analog converter according to further embodiments of the invention includes first and second lower bit decoders and a quarter-type decoder, first and second lower bit decoder output switching circuits, and an averaging amplifier. The first lower bit decoder is configured to select one of a plurality of first gamma reference voltages based on lower D bits of an N-bit digital data word, the plurality of first gamma reference voltages corresponding to a first nonlinear interval among a plurality of gamma reference voltages. The second lower bit decoder is configured to select one of a plurality of second gamma reference voltages based on the lower D bits of the N-bit digital data word, the plurality of second gamma reference voltages corresponding to a second nonlinear interval among the plurality of gamma reference voltages.

The quarter-type decoder is configured to receive a plurality of third gamma reference voltages, and to select four of the plurality of third gamma reference voltages based on the N-bit digital data word, the plurality of third gamma reference voltages corresponding to a linear interval among the plurality of gamma reference voltages and respectively having a four gray scale level difference between adjacent ones of the plurality of third gamma reference voltages.

The first lower bit decoder output switching circuit is configured to switch four fourth gamma reference voltages based on upper (N–D) bits of the N-bit digital data word, the selected first gamma reference voltage being divided into the four fourth gamma reference voltages by the first lower bit decoder output switching circuit. The second lower bit decoder output switching circuit is configured to switch four fifth gamma reference voltages based on upper (N–D) bits of the N-bit digital data word, the selected second gamma reference voltage being divided into the four fifth gamma reference voltages by the second lower bit decoder output switching circuit The averaging amplifier is configured to output an average gamma reference voltage of the four third gamma reference voltages, or an average gamma reference voltage of the four fourth gamma reference voltages, or an average gamma reference voltage of the four fifth gamma reference voltages.

In some embodiments of the invention, N equals 10 and/or D equals 3.

The gamma reference voltages may have 1024 levels for representing a 0th gray scale level through a 1023rd gray scale level. The first gamma reference voltages represent a 0th gray scale level through a 7th gray scale level, and/or the third gamma reference voltages may represent the 8th gray scale level through the 1015th gray scale level. The second gamma reference voltages may represent a 1016th gray scale level through a 1023rd gray scale level.

More generally, the first gamma reference voltages may represent a 0th gray scale level through an (M×8−1)th gray scale level, the second gamma reference voltages represent (P×8)th gray scale level through a last gray scale level.

The four third gamma reference voltages may be combinations of Vn and Vn+4, where Vn is a gamma reference voltage among the plurality of third gamma reference voltages and Vn+4 is a gamma reference voltage that is 4 gray scale levels higher than Vn.

The first lower bit decoder and the second lower bit decoder may receive bit values of the lower D bits and inverted bit values of the lower D bits.

A digital-to-analog converter may further include a gamma reference voltage generating circuit configured to generate the plurality of gamma reference voltages for representing a plurality of gray scale levels.

The first lower bit decoder may include a plurality of MOS transistor arrays configured to select one of the first gamma reference voltages. Each of the MOS transistor arrays may have D MOS transistors, and the number of the MOS transistor arrays may correspond to the number of the first gamma reference voltages. A bit value or an inverted bit value of one of the lower D bits may be input into a gate of each of the D MOS transistors in each of the MOS transistor arrays.

The second lower bit decoder may include a plurality of MOS transistor arrays configured to select one of the second gamma reference voltages. Each of the MOS transistor arrays may have D MOS transistors, and the number of the MOS transistor arrays may correspond to the number of the second gamma reference voltages. A bit value or an inverted bit value of one of the lower D bits input into a gate of each of the D MOS transistors in each of the MOS transistor arrays.

The first lower bit decoder output switching circuit may include a NOR gate and a first switching circuit, the NOR gate outputting logic signals based on the upper (N–D) bits. The first switching circuit may divide the selected first gamma reference voltage into the four fourth gamma reference voltages and may switch the four fourth gamma reference voltages based on the logic signals from the NOR gate.

The first switching circuit may include four MOS transistors, and may divide the selected first gamma reference voltage into the four fourth gamma reference voltages and transmit the four fourth gamma reference voltages to the averaging amplifier. The four MOS transistors may receive the logic signals from the NOR gate through gates of the four MOS transistors.

The second lower bit decoder output switching circuit may include an AND gate and a second switching circuit. The AND gate may output logic signals based on the upper (N–D) bits. The first switching circuit may divide the selected second gamma reference voltage into the four fifth gamma reference voltages and may switch the four fifth gamma reference voltages based on the logic signals from the AND gate.

The second switching circuit may include four MOS transistors, and may divide the selected second gamma reference voltage into the four fifth gamma reference voltages and transmit the four fifth gamma reference voltages into the averaging amplifier. The four MOS transistors may receive the logic signals from the AND gate through gates of the four MOS transistors.

The first lower bit decoder output switching circuit may further include four MOS transistor arrays that divide the selected first gamma reference voltage into the four fourth gamma reference voltages and switch the four fourth gamma reference voltages based on the upper (N–D) bits. Each of the four MOS transistor arrays of the first lower bit decoder output switching circuit may include (N–D) MOS transistors coupled in series that receive bit values or inverted bit values of the upper (N–D) bits through respective gates of the (N–D) MOS transistors.

The second lower bit decoder output switching circuit may further include four MOS transistor arrays that divide the selected second gamma reference voltage into the four fifth gamma reference voltages and switch the four fifth gamma reference voltages based on the upper (N–D) bits. Each of the four MOS transistor arrays of the second lower bit decoder output switching circuit may include (N–D) MOS transistors coupled in series that receive bit values or inverted bit values of the upper (N–D) bits through respective gates of the (N–D) MOS transistors.

A source driver of a display device according to some embodiments of the invention includes a control circuit and a digital-to-analog converter. The control circuit is configured to generate a digital data word corresponding to a gray scale voltage level for a display panel. The digital-to-analog converter is coupled to the control circuit and is configured to generate a plurality of gamma reference voltages for representing a plurality of gray scales and to generate an analog gray scale voltage by decoding a gamma reference voltage corresponding to a nonlinear interval of the plurality of gamma reference voltages with a full-type decoder and by decoding a gamma reference voltage corresponding to a linear interval of the plurality of gamma reference voltages with a fractional decoder, based on the digital data word generated by the control circuit.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 3 is a table illustrating operations of a half-type decoder 80 illustrated in FIG. 2.

FIG. 5 is a table illustrating operations of a quarter-type decoder 90 illustrated in FIG. 4.

FIG. 11 is a table illustrating operations of the digital-to-analog converter illustrated in FIG. 10.

FIG. 13 is a table illustrating operations of the digital-to-analog converter illustrated in FIG. 12.

DETAILED DESCRIPTION OF THE EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
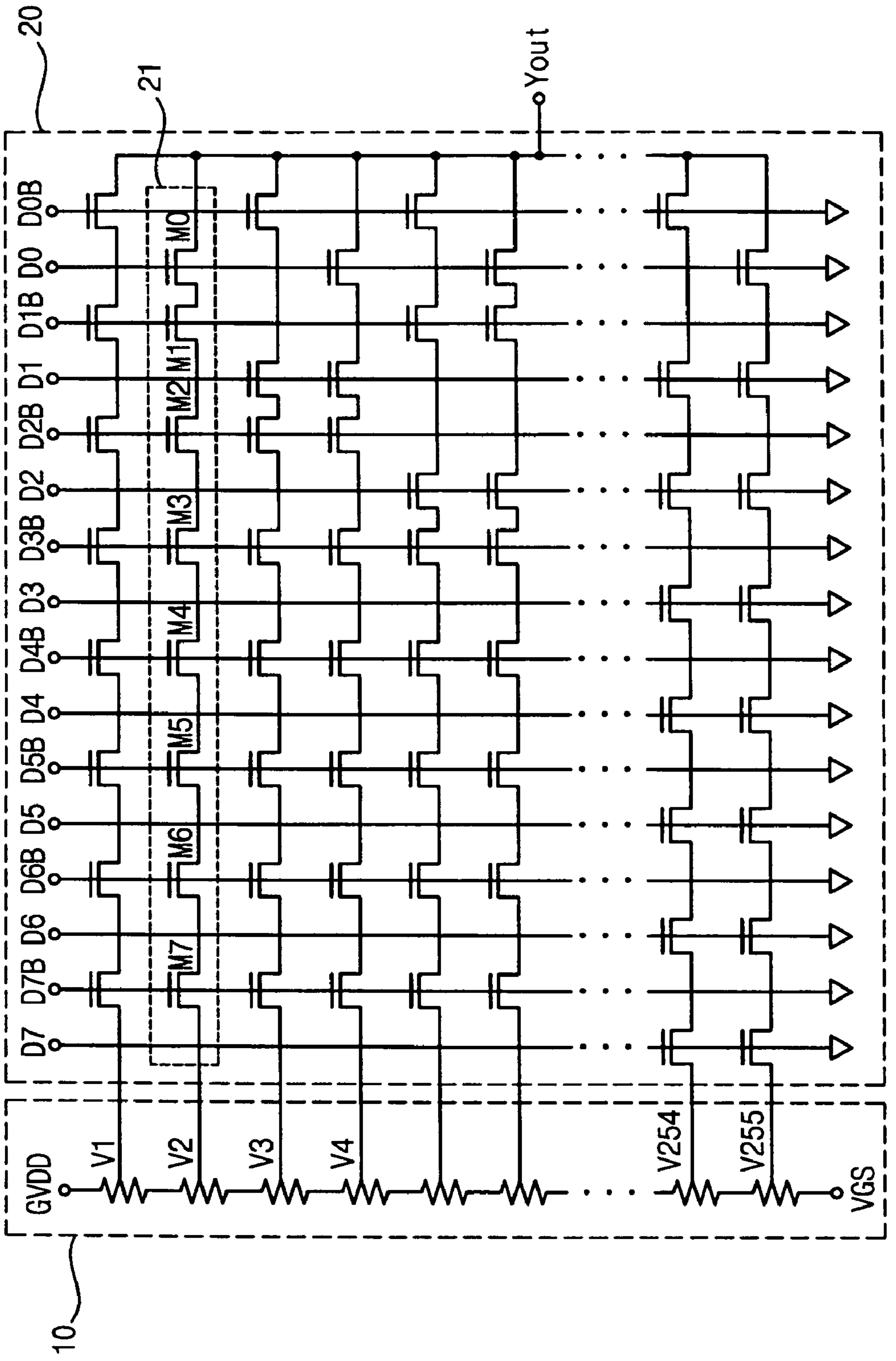
FIG. 1 (PRIOR ART)
FIG. 1 is a circuit diagram illustrating a conventional digital-to-analog converter having a full-type decoder.
Figure 2:
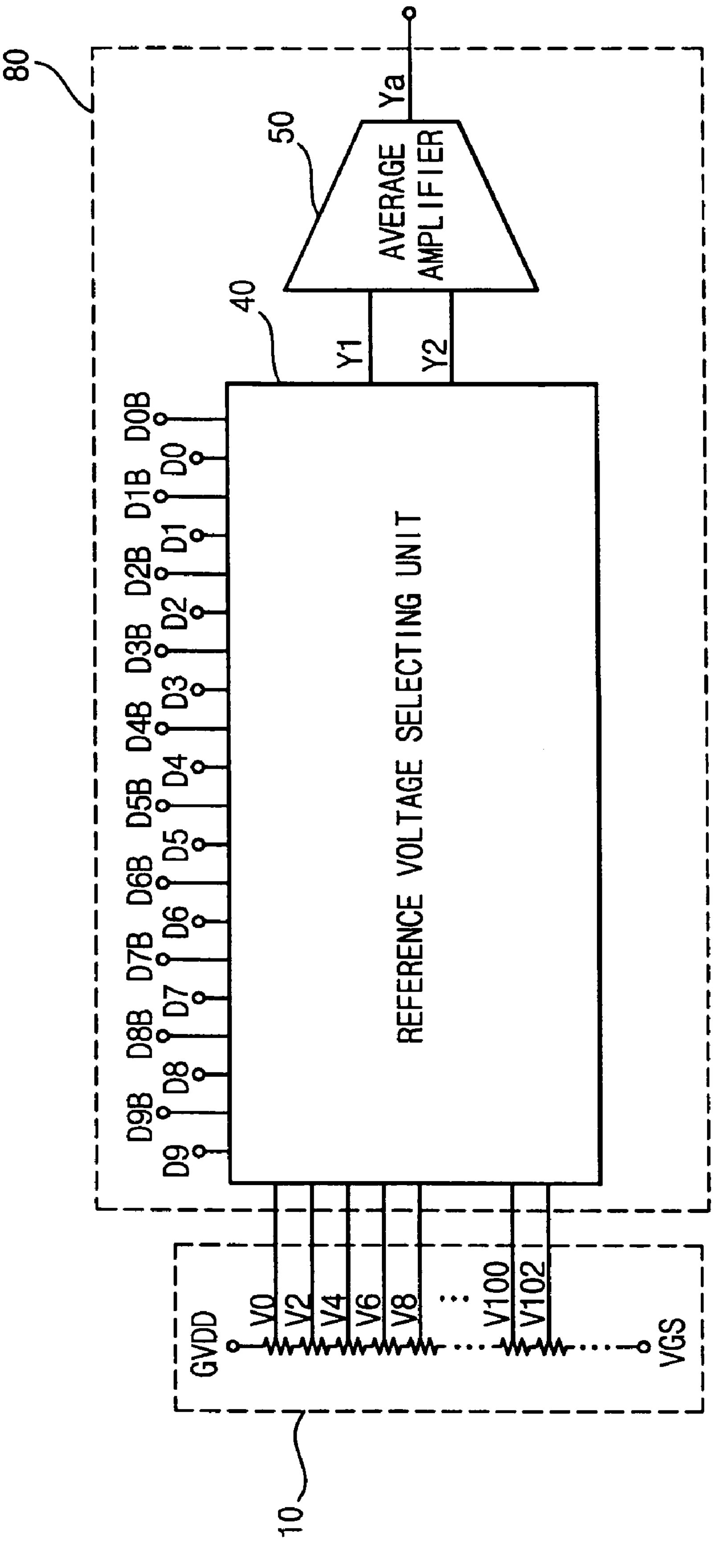
FIG. 2 (PRIOR ART)
FIG. 2 is a circuit diagram illustrating a conventional 10-bit standard half-type decoder used in a source driver IC.
Figure 4:
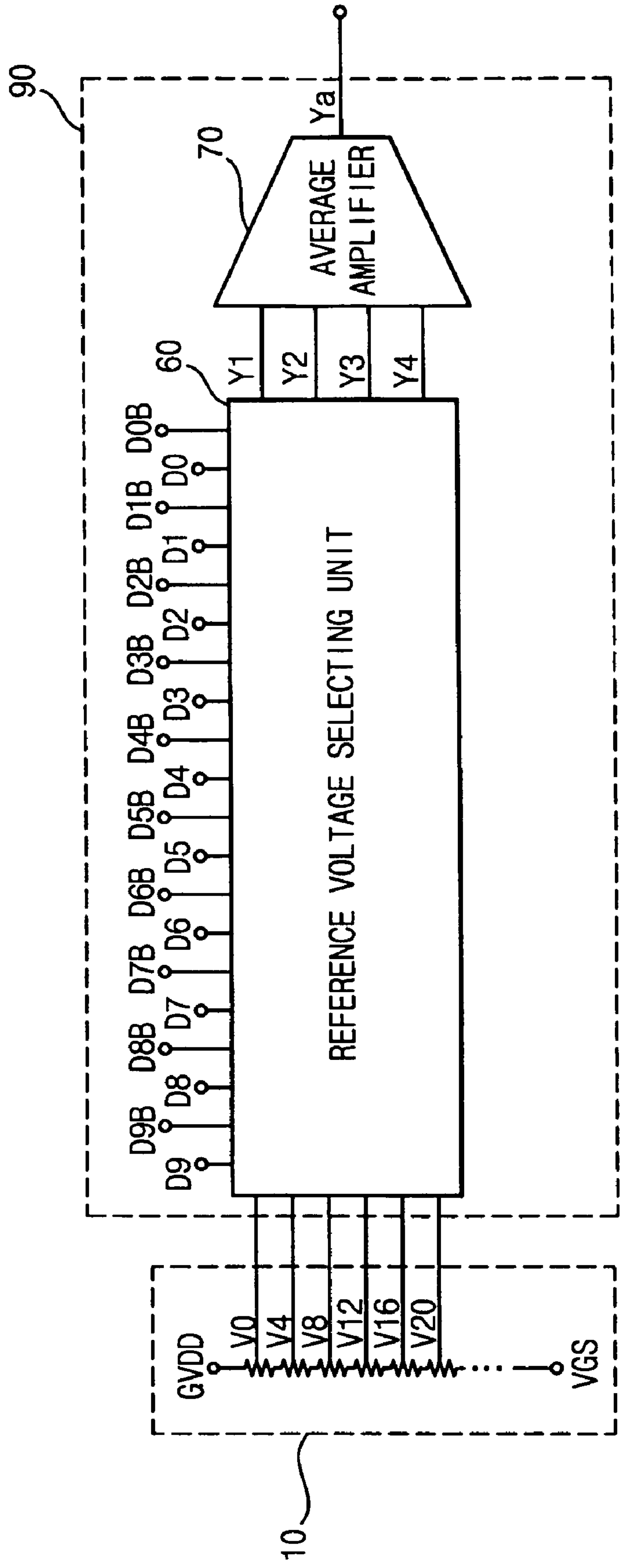
FIG. 4 (PRIOR ART)
FIG. 4 is a circuit diagram illustrating a conventional 10-bit standard quarter-type decoder used in a source driver IC.
Figure 6:
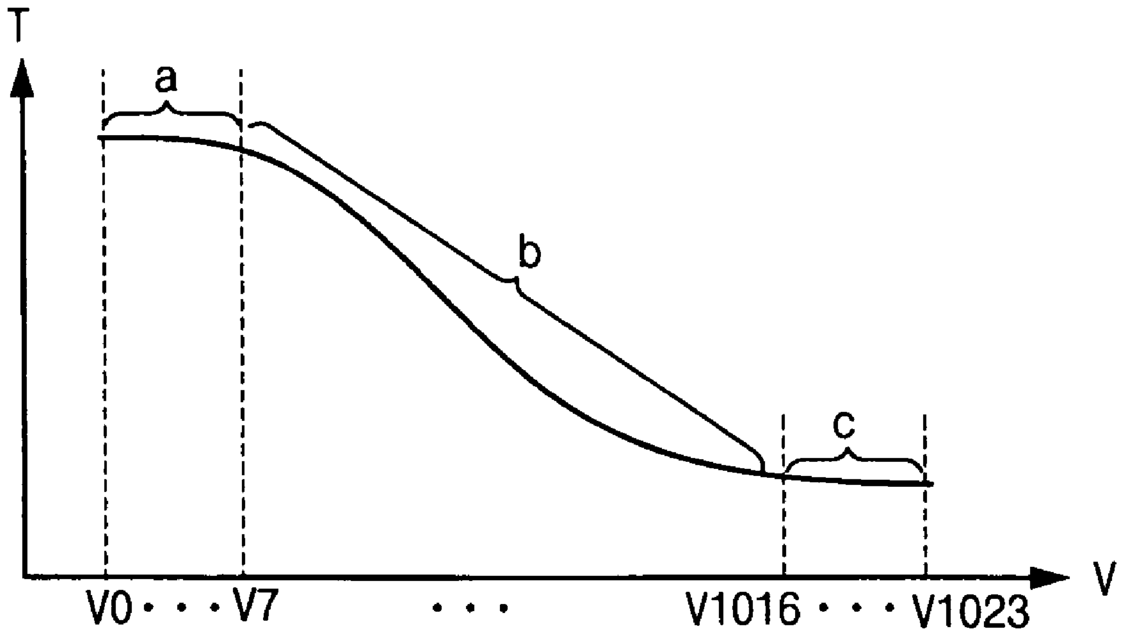
FIG. 6 is a graph illustrating a gamma curve of gamma reference voltages.
Figure 7:
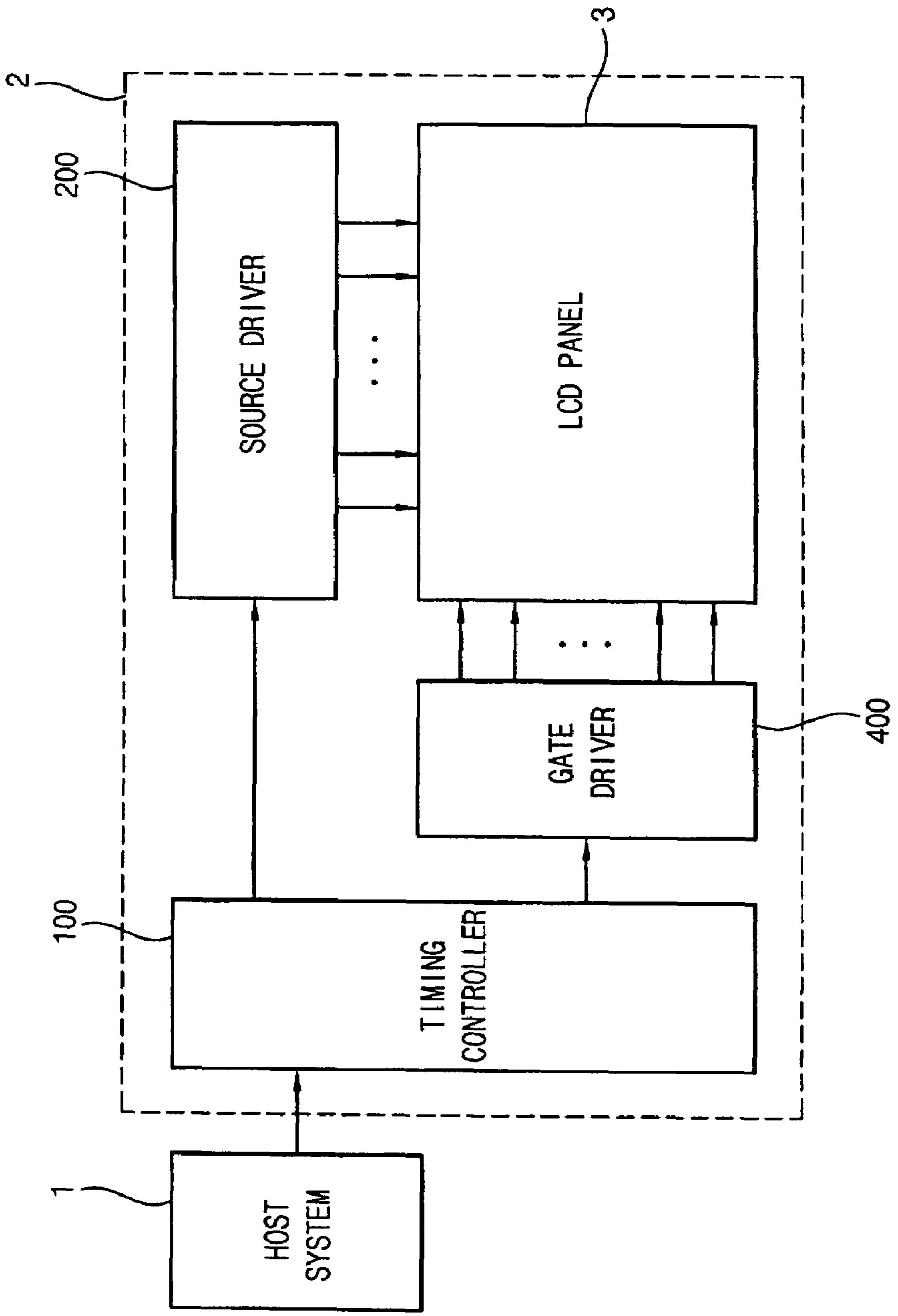
FIG. 7 is a block diagram illustrating an LCD device according to some embodiments of the present invention.

FIG. 7 is a block diagram illustrating functional elements of an LCD device. While embodiments of the invention are described in connection with an LCD display, it will be appreciated that embodiments may be used in conjunction with other types of displays, such as organic LED (OLED) displays.

As illustrated in FIG. 7, an LCD device 2 includes an LCD panel 3, a timing controller 100, a gate driver 400 and a source driver 200.

The LCD panel 3 includes a plurality of gate lines, data lines which respectively are arranged substantially in perpendicular direction with respect to the gate line, and unit pixels which are formed on the points that each of the gate lines and data lines intersect at right angles. A typical unit pixel may include an LCD capacitor and a switching TFT (Thin Film Transistor).

The timing controller 100 transforms the data format of the RGB signal received from an external host system 1 and transmits the transformed RGB signals to the source driver 200. In addition, the timing controller 100 generates various control signals to apply the various control signals into the source driver 200 and the gate driver 400.

The gate driver 400 receives control signals applied from the timing controller 100 and applies gate driving signals into the gate lines, thereby sequentially driving each of the gate lines.

The source driver 200 receives control signals and digital data from the timing controller 100, and transforms the digital data into analog gray scale voltages for driving the LCD panel 3 according to the applied control signals, thereby applying the analog gray scale voltages into the data lines of the LCD panel 3.

Figure 8:
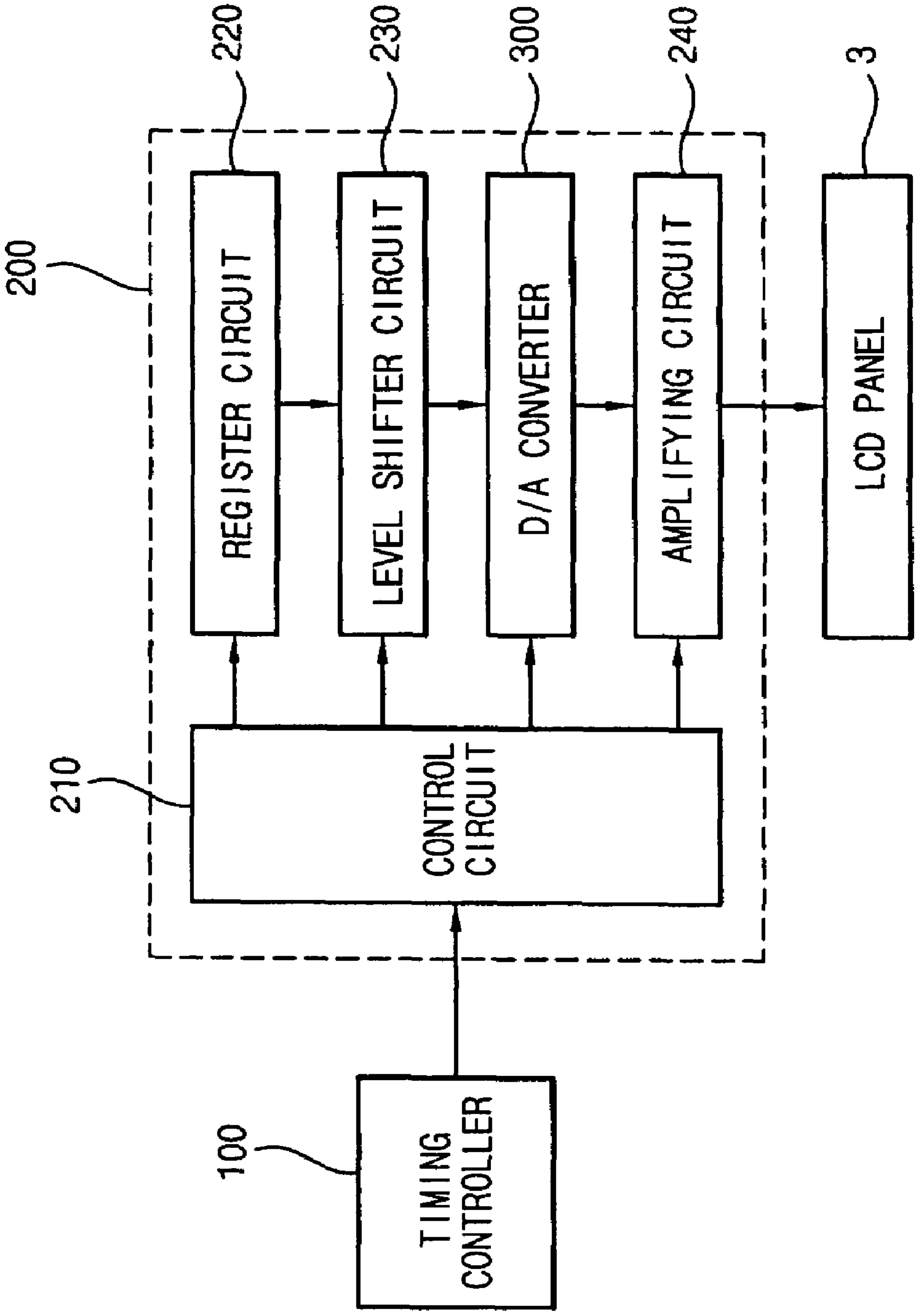
FIG. 8 is a block diagram illustrating a source driver according to some embodiments of the invention.

FIG. 8 is a block diagram illustrating the source driver 200 illustrated in FIG. 7.

Referring to FIG. 8, the source driver 200 includes a control circuit 210, a register circuit 220, a level shifter circuit 230, a digital-to-analog converter 300, and an amplifying circuit 240.

The control circuit 210 receives control signals, such as SSP (Source driver Start Pulse) and data clock, etc., from the timing controller 100 and controls each of the circuits 220, 230, 300 and 240. The control circuit 210 receives digital data, i.e. RGB code, from the timing controller 100 and applies the digital data into corresponding circuits.

The register circuit 220 stores the digital data applied from the control circuit 210. Because the register circuit 220 and the digital-to-analog converter 300 operate at low voltage and at high voltage respectively, the level shifter circuit 230 transforms the voltage level of the outputs of the register circuit 220 so that the digital data provided from the register circuit 220 can be input to the digital-to-analog converter 300.

The digital-to-analog converter 300 generates gamma reference signals and receives digital data which are level-shifted through the level shifter circuit 230, and then outputs analog gray scale voltages by selecting an appropriate gamma reference voltage based on the digital data.

The amplifying circuit 240 amplifies the analog gray scale voltages from the digital-to-analog converter 300 and outputs the amplified analog gray scale voltages to the data lines of the LCD panel 3.

Figure 9:
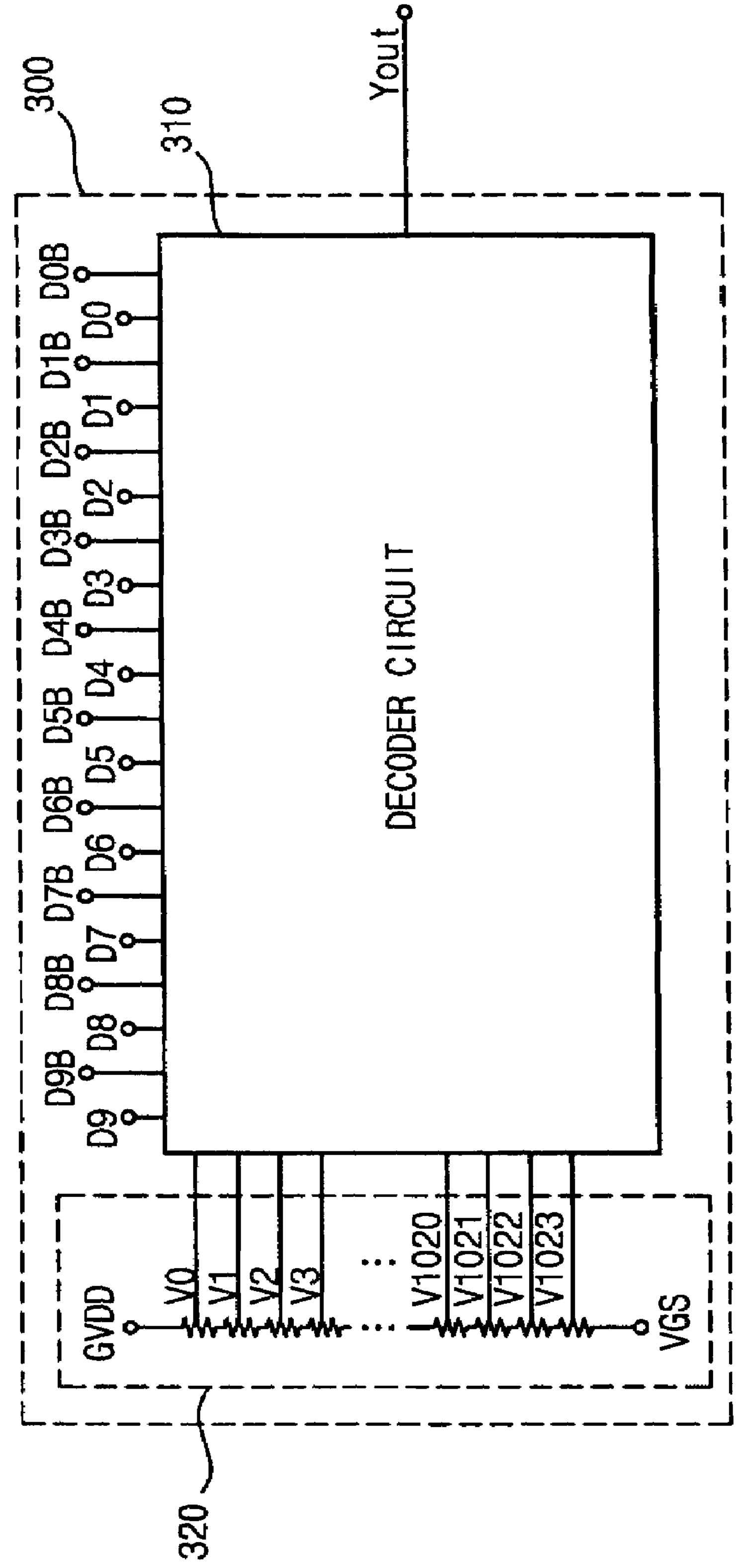
FIG. 9 is a circuit diagram illustrating a 10-bit digital-to-analog converter according to some embodiments of the present invention.

FIG. 9 is a circuit diagram illustrating a mixed type digital-to-analog converter 300 configured to convert 10-bit digital data, according to some embodiments of the present invention.

As illustrated in FIG. 9, a mixed type digital-to-analog converter 300 includes a gamma reference voltage generating circuit 320 and a decoder circuit 310. The gamma reference voltage generating circuit 320 generates gamma reference voltages having a plurality of voltage levels. The decoder circuit 310 receives 10-bit digital data to select one of the gamma reference voltages applied from the gamma reference voltage generating circuit 320.

The gamma reference voltage generating circuit 320 includes a plurality of resistor arrays connected between VGDD and VGS in series, and generates 268 gamma reference voltages that may be used to represent 0~1023 gray scale levels using a voltage divider such as the resistor array shown in FIG. 9.

Although not illustrated, a gamma compensation circuit capable of compensating for the gamma reference voltages can be implemented in the gamma reference voltage generating circuit 320 so that the compensated gamma reference voltages can conform to a desired gamma curve.

In FIG. 9, although the gamma reference voltage generating circuit 320 has been included in the digital-to-analog converter 300 of the source driver 200, alternatively, the gamma reference voltage generating circuit 320 may be implemented outside the source driver 200, and the gamma reference voltages can be applied into the digital-to-analog converter 300 from the external gamma reference voltage generating circuit 320. That is, the gamma reference voltage generating circuit 320 may be implemented separately from the digital-to-analog converter 300, and not in the digital-to-analog converter 300.

The decoder circuit 310 receives gamma reference voltages from the gamma reference voltage generating circuit 320 and selects one of the gamma reference voltages by decoding the data signal with a full-type decoder, in nonlinear interval (a, c), i.e. V0~V7 and V1016~V1023. In the linear interval (b), i.e. V8~V1015, the decoder circuit 310 outputs the gamma reference voltages by decoding with a quarter-type decoder.

The nonlinear interval (a, c) of the gamma curve may correspond to different number of gray scales depending on the property of the gamma curve. The nonlinear interval (a, c) may respectively correspond to M×23 gray scales. For example, M may be 1.

For example, in case where the nonlinear interval (a, c) of the gamma curve is more wide, the nonlinear interval (a, c) respectively may be extended to correspond to 16 gamma reference voltages, and the gamma reference voltages corresponding to the intervals of V0~V5 and V1008~V1023 may be decoded with the full-type decoder.

As above-mentioned, in the full-type decoder, the full-type decoder receives all the gamma reference voltages and outputs one of the gamma reference voltages based on the input digital data. In addition, the quarter-type decoder receives two given gamma reference voltages and outputs four gamma reference voltages, i.e. Y1, Y2, Y3 and Y4, based on the input digital data, and then, outputs the gamma reference voltages which are between the two given gamma reference voltages by using average voltage, i.e. Ya, of the four voltages Y1, Y2, Y3 and Y4.

Figure 10:
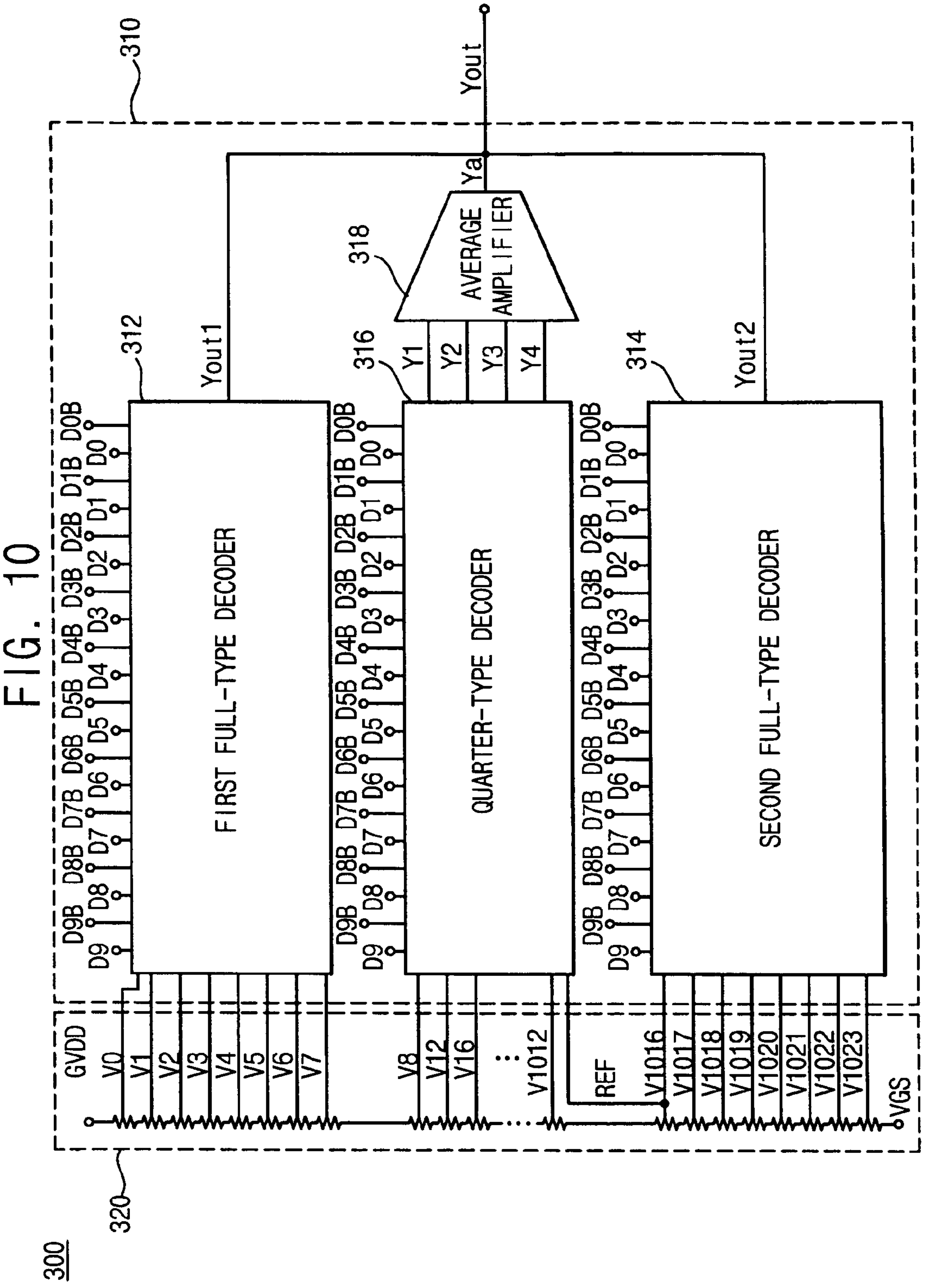
FIG. 10 is a circuit diagram illustrating a decoder circuit for a digital-to-analog converter according to some embodiments of the invention.

FIG. 10 is a circuit diagram illustrating a decoder circuit 310 of a digital-to-analog converter 300 illustrated in FIG. 9.

Referring to FIG. 10, the decoder circuit 310 includes a first full-type decoder 312, a second full-type decoder 314, a quarter-type decoder 316, and an averaging amplifier 318.

The first full-type decoder 312 receives the gamma reference voltages corresponding to the first nonlinear interval (a) of the gamma curve, among the gamma reference voltages, and then outputs one gamma reference voltage, i.e. Yout1, based on 10-bit digital data.

That is, the first full-type decoder 312 receives the gamma reference voltages, i.e. V0, V1, V2, V3, V4, V5, V6 and V7 corresponding to the first nonlinear interval (a) of the gamma curve, and then, selects one of the gamma reference voltages, i.e. V0~V7, based on the digital data, i.e. bit values D9, D8, D7, D6, D5, D4, D3, D2, D1 and D0 and inverted values of each of the bit values, i.e. D9B, D8B, D7B, D6B, D5B, D4B, D3B, D2B, D1B and D0B.

The second full-type decoder 314 receives the gamma reference voltages corresponding to the second nonlinear interval (c) of the gamma curve, among the gamma reference voltages, and then outputs one gamma reference voltage, i.e. Yout2, based on the 10-bit digital data.

That is, the second full-type decoder 314 receives the gamma reference voltages, i.e. V1016, V1017, V1018, V1019, V1020, V1021, V1022 and V1023 corresponding to the second nonlinear interval (c) of the gamma curve, and then, selects one of the gamma reference voltages, i.e. V1016~V1023, based on the digital data, i.e. bit values D9, D8, D7, D6, D5, D4, D3, D2, D1 and D0 and inverted values of each of the bit values, i.e. D9B, D8B, D7B, D6B, D5B, D4B, D3B, D2B, D1B and D0B.

The gamma reference voltage which is output from the first full-type decoder 312 or the second full-type decoder 314, is input to the amplifying circuit 240 illustrated in FIG. 8, amplified, and then, applied to the LCD panel 3.

The quarter-type decoder 316 receives the gamma reference voltages corresponding to the linear interval (b) of the gamma curve, every 4 gray scales among the gamma reference voltages, and then outputs four gamma reference voltages, based on the 10-bit digital data, by using one given gamma reference voltage Vn and a gamma reference voltage Vn+4 4 gray scale levels higher than Vn.

That is, the quarter-type decoder 316 receives the gamma reference voltages, i.e. V8, V12, V16, V20, V24, . . . , V1004, V1008, V1012 and V1016 corresponding to the linear interval (b) of the gamma curve, and then, outputs 4 gamma reference voltages, i.e. Y1, Y2, Y3 and Y4, to the averaging amplifier 318, based on the 10-bit digital data, i.e. bit values D9, D8, D7, D6, D5, D4, D3, D2, D1 and D0 and inverted values of each of the bit values, i.e. D9B, D8B, D7B, D6B, D5B, D4B, D3B, D2B, D1B and D0B, by using one given gamma reference voltage Vn and a gamma reference voltage Vn+4 4 gray scale levels higher than Vn.

The averaging amplifier 318 averages 4 gamma reference voltages from the quarter-type decoder 316 to output an average gamma reference voltage into the amplifying circuit 240 illustrated in FIG. 8. The output average voltage is Vn or Vn+1 or Vn+2 or Vn+3. Therefore, all of the voltages, i.e. Vn+1 or Vn+2 or Vn+3, (between Vn and Vn+4) can be generated by using the property of the linear interval (b) of the gamma reference voltage.

The averaging amplifier 318 may be included in the decoder circuit 310 of the digital-to-analog converter 300, such as in the example embodiment in FIG. 9. However, the averaging amplifier 318 may be included in the amplifying circuit 240 in FIG. 8, so that the amplifying circuit 240 has a function of the averaging amplifier with respect to signals Y1–Y4.

FIG. 11 is a table illustrating operations of a mixed type digital-to-analog converter 300 illustrated in FIG. 10.

Referring to FIG. 10 and FIG. 11, in the case where digital data '0000000001' are input into the decoder circuit 310, the gamma reference voltage, V1 has been selected through the first full-type decoder 312 and output as Yout1. In addition, in the case where digital data '0000000111' are input into the decoder circuit 310, the gamma reference voltage V7 is output as Yout1 through the first full-type decoder 312.

In addition, in the case where digital data '0000001000' are input, V8, V8, V8, V8 are output to the averaging amplifier 318 through the quarter-type decoder 316, and the averaging amplifier 318 outputs average voltage V8. That is, Y1 is V8, Y2 is V8, Y3 is V8, Y4 is V8, and Ya is V8. In addition, in the case where digital data '0000001010' are input, V8, V8, V12, V12 are output to the averaging amplifier 318 through the quarter-type decoder 316, and the averaging amplifier 318 outputs average voltage, V10.

In addition, in the case where digital data '1111111001' are input into the decoder circuit 310, the gamma reference voltage V1016 is selected through the second full-type decoder 314 and output as Yout2. In addition, in the case where digital data '1111111111' are input into the decoder circuit 310, the gamma reference voltage V1023 is output as Yout2 through the second full-type decoder 314.

The gamma reference voltage V1016 is output through the second full-type decoder 314 in response to the digital data '1111111001', at the same time, V1016 is used by the quarter-type decoder 316 together with V1012 so as to represent the gamma reference voltages V1013, V1014 and V1015.

Therefore, the gamma reference voltage, V1016 is applied into both the second full-type decoder 314 and the quarter-type decoder 316. However, the quarter-type decoder 316 does not operate when the digital data '1111111001' are input. Alternatively, V1016 may be used by the quarter-type decoder 316. In this case, the gamma reference voltage V1016 is applied only to the quarter-type decoder 316 to be selected based on the digital data, and the gamma reference voltages V1017~V1023 are input into the second full-type decoder 314.

As explained in the discussion of the embodiments of FIG. 9, a quarter-type decoder 316 capable of reducing the chip area and a pair of full-type decoders 312, 314 capable of outputting accurate voltage can be arranged properly in the linear interval (b) and non linear intervals (a, c), respectively, of the gamma reference voltage.

Figure 12:
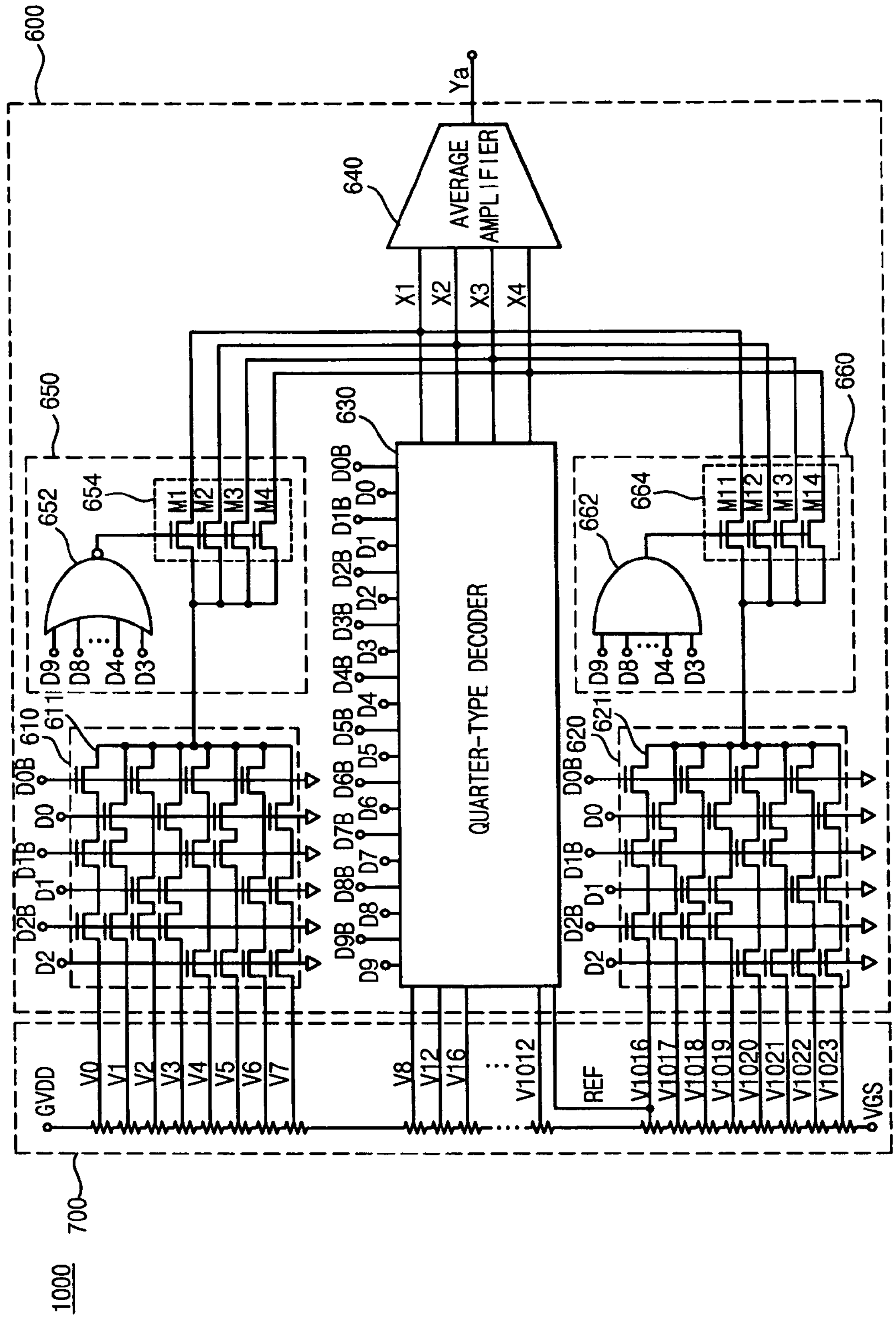
FIG. 12 is a circuit diagram illustrating a 10-bit digital-to-analog converter according to further embodiments of the present invention.

FIG. 12 is a circuit diagram illustrating a mixed type digital-to-analog converter 1000 having 10-bit digital data, according to further embodiments of the present invention.

As illustrated in FIG. 12, the mixed type digital-to-analog converter 1000 includes a gamma reference voltage generating circuit 700 which generates the gamma reference voltages having a plurality of levels and a decoder circuit 600 which receives 10-bit digital data D0-D9 to select one of the gamma reference voltages based on the 10-bit digital data The gamma reference voltage generating circuit 700 includes a plurality of resistance arrays connected between GVDD and VGS in series, and generates 268 gamma reference voltages having 268 voltage levels using a voltage divider such as the resistor arrays shown in FIG. 12. That is, the reference voltage generating circuit 700 generates the reference voltages V0–V7 in the first nonlinear region (a) of the gamma curve, the reference voltages V8, V12, V16, . . . , V1008, V1012 in the linear region (b) and the reference voltages V1016-V1023 in the second nonlinear region (c) of the gamma curve, Although not illustrated, a gamma compensation circuit capable of compensating the gamma reference voltages can be implemented in the gamma reference voltage generating circuit 700 so that the compensated gamma reference voltages can conform an ideal gamma curve.

In addition, as mentioned in the discussion of the embodiments of FIG. 9, the gamma reference voltage generating circuit 700 may be implemented outside the source driver 200, and the gamma reference voltages can be applied into the digital-to-analog converter 1000 from the external gamma reference voltage generating circuit 700. That is, the gamma reference voltage generating circuit 700 may be implemented separately from the digital-to-analog converter 300, and not in the digital-to-analog converter 1000.

The decoder circuit 600 receives the gamma reference voltages from the gamma reference voltage generating circuit 700 and selects one of the gamma reference voltages by decoding with a full-type decoder, in nonlinear interval (a, c), i.e. V0~V7 and V1016~V023. In linear interval (b), i.e. V8~V1015, The decoder circuit 600 outputs the gamma reference voltage by decoding with a quarter-type decoder 630.

The nonlinear interval (a, c) of the gamma curve may correspond to different number of gray scales depending on the property of the gamma curve, and the nonlinear interval (a, c) may correspond to M×23 gray scales. For example, M may be equal to 1.

For example, in case where the nonlinear interval (a, c) of the gamma curve is wider, the gamma reference voltages corresponding to the interval of V0~V15 and V1008~V1023 may be decoded with the full-type decoder by expanding the nonlinear interval (a, c) to have 16 gamma reference voltages.

The decoder circuit 600 includes a first lower bit decoder 610, a first lower bit decoder output switching circuit 650, a second lower bit decoder 620, a second lower bit decoder output switching circuit 660, and an averaging amplifier 640.

The first lower bit decoder 610 receives the gamma reference voltages corresponding to the first nonlinear interval (a) of the gamma curve, among the gamma reference voltages, and then outputs one gamma reference voltage, based on the value of the lower three bits D0–D2 among the 10-bit digital data D0–D9.

That is, the first lower bit decoder 610 receives the gamma reference voltages, i.e. V0, V1, V2, V3, V4, V5, V6 and V7 corresponding to the first nonlinear interval (a) of the gamma curve, and then, selects one of the gamma reference voltages, i.e. V0~V7, based on the lower three bits, i.e. bit values D2, D1 and D0 and inverted values of each of the bit values, i.e. D2B, D1B and D0B.

The first lower bit decoder 610 includes eight MOS transistor arrays 611 having three MOS transistors respectively so as to select each of the gamma reference voltages, i.e. V0, V1, V2, V3, V4, V5, V6 and V7, based on the lower three bits values. The lower three bits values or inverted values of each of the bit values are input into the gates of each of the MOS transistors so that selected ones of the MOS transistors turn on based on the bit input.

The first lower bit decoder output switching circuit 650 receives the upper seven bit values D9–D3 among the digital data, and, based on the upper seven bits values, transmits an output voltage which is from the first lower bit decoder 610 into the averaging amplifier 640, or cuts off the output voltage. The first lower bit decoder output switching circuit 650 transmits the output of the first lower bit decoder 610 into the averaging amplifier 640 only when the value of the upper seven bits D9–D3 is '0000000', and cuts off output voltage of the first lower bit decoder 610 when a different bit value is input, because the first nonlinear interval (a) of the gamma reference corresponds to the gamma reference voltages, i.e. V0~V7, in which all of the upper seven bits D9–D3 are '0'.

The first lower bit decoder output switching circuit 650 includes a NOR gate 652 and a first switching circuit 654. The NOR gate 652 receives upper seven bits values of the digital data, and outputs a logic signal. The first switching circuit 654 receives output voltage from the first lower bit decoder 610 and outputs four output voltages, and switches the four output voltages based on the logic signal from the NOR gate 652 so that the four output voltages are transmitted to the averaging amplifier 640 when the logic signal output from the NOR gate 652 is high, or are not transmitted to the averaging amplifier 640 when the logic signal output from the NOR gate 652 is low.

The first switching circuit 654 includes four MOS transistors M1, M2, M3 and M4, which respectively receive the output signal from the first lower bit decoder 610 and transmit the four output signals to the averaging amplifier 640, and receive the logic signal from the NOR gate 652 through a gate of the respective four MOS transistors M1, M2, M3 and M4.

The second lower bit decoder 620 receives the gamma reference voltages corresponding to the second nonlinear interval (c) of the gamma curve, among the gamma reference voltages, and then outputs one gamma reference voltage, based on the lower three bits values among the 10-bit digital data.

That is, the second lower bit decoder 620 receives the gamma reference voltages, i.e. V1016, V1017, V1018, V1019, V1020, V1021, V1022 and V1023 corresponding to the second nonlinear interval (c) of the gamma curve, and then, selects one of the gamma reference voltages, i.e. V1016~V1023, based on the lower three bits, i.e. bit values D2, D1 and D0 and inverted values of each of the bit values, i.e. D2B, D1B and D0B.

The second lower bit decoder 620 includes eight MOS transistor arrays 611 respectively having three MOS transistors so as to select each of the gamma reference voltages, i.e. V1016, V1017, V1018, V1019, V1020, V1021, V1022 and V1023, based on the lower three bits values. The lower three bits values or inverted values of each of the bit values are input into the gates of each of the MOS transistors so that selected ones of the MOS transistors turns on based on the bit input.

The second lower bit decoder output switching circuit 660 receives the upper seven bit values D9–D3 among the digital data, and transmits an output voltage which is from the second lower bit decoder 620 into the averaging amplifier 640, or cuts off the output voltage based on the value of the upper seven bits D9–D3. The second lower bit decoder output switching circuit 660 transmits output of the second lower bit decoder 620 into the averaging amplifier 640 only when the value of the upper seven bits D9–D3 is '1111111', and cuts off output voltage of the second lower bit decoder 620 when a different bit value is input, because the second nonlinear interval (c) of the gamma reference corresponds to the gamma reference voltages, i.e. V1016~V1023, in which all of the upper seven bits are '1'.

The second lower bit decoder output switching circuit 660 includes an AND gate 662 and a second switching circuit 664. The AND gate 662 receives the upper seven bit values D9–D3 of the digital data, and outputs a logic signal. The second switching circuit 664 receives the output voltage from the second lower bit decoder 620, and switches the 4 output voltages based on the logic signal from the AND gate 662.

The second switching circuit 664 includes four MOS transistors, i.e. M11, M12, M13 and M14, which receive the output signal from the second lower bit decoder 620 and transmits the four output signals to the averaging amplifier 640 in response to the logic signal received from the AND gate 662 through the gates of the four MOS transistors M11-M14.

The configuration of the first lower bit decoder output switching circuit 650 and the second lower bit decoder output switching circuit 660 may be changed when the first nonlinear interval (a) and the second nonlinear interval (c) correspond to different gray scales.

The case that the first nonlinear interval (a) is V0~V7 and the second nonlinear interval (c) is V1016~V1023 has been explained previously. However, when V0~V5 is established as gamma reference voltages corresponding to the first nonlinear interval (a), one more decoder similar to the first lower bit decoder 610 may be additionally used to select the gamma reference voltages, V8~V15, and one more output switching circuit similar to the first lower bit decoder output switching circuit 650 may additionally be used. In this case, an inverted signal may be input into an input terminal of 'D3' of the one more output switching circuit so that the output of the decoder is transmitted only when the upper seven bits value is '0000001'.

Similarly, in case of the second nonlinear interval (c), one more decoder similar to the second lower bit decoder 620 and one more output switching circuit similar to the second lower bit decoder output switching circuit 660 may be used, and the input of the AND gate of the output switching circuit would be adjusted.

The quarter-type decoder 630 receives the 252 gamma reference voltages corresponding to the linear interval (b) of the gamma curve among the gamma reference voltages, the gamma reference voltages having 4 gray scale difference from each other, and then the quarter-type decoder 630 outputs four gamma reference voltages based on the 10-bit digital data by using one given gamma reference voltage and a gamma reference voltage 4 gray scale higher than the given gamma reference voltage.

That is, the quarter-type decoder 316 receives the gamma reference voltages, i.e. V8, V12, V16, V20, V24, . . . , V1004, V1008, V1012 and V1016 corresponding to the linear interval (b) of the gamma curve, and then outputs 4 gamma reference voltages into the averaging amplifier 640, based on the 10-bit digital data, i.e. bit values D9, D8, D7, D6, D5, D4, D3, D2, D1 and D0 and inverted values of each of the bit values, i.e. D9B, D8B, D7B, D6B, D5B, D4B, D3B, D2B, D1B and D0B, by using one given gamma reference voltage Vn and a gamma reference voltage Vn+4 4 gray scale levels higher than Vn+4.

The averaging amplifier 640 averages 4 gamma reference voltages, i.e. X1, X2, X3, X4 input from the first lower bit decoder output switching circuit 650 or from the second lower bit decoder output switching circuit 660 or from the quarter-type decoder 630 to output average gamma reference voltage, i.e. Ya, into the amplifying circuit 240 illustrated in FIG. 8.

The average voltage from the averaging amplifier 640 is the same as the input voltage in case where the voltage output from the first lower bit decoder 610 or the second lower bit decoder 620 is input into the averaging amplifier 640, because all of the four input voltages to be transmitted are the same as one of the gamma reference voltages, V0~V7 or one of the gamma reference voltages, V1016~V1023.

In case where the voltage Vn or combination voltage of Vn and Vn+4 output from the quarter-type decoder 630 is input into the averaging amplifier 640, The average voltage (i.e. one of Vn, Vn+1, Vn+2, and Vn+3) of four voltages output from the the quarter-type decoder 630 is output from the averaging amplifier 640.

The averaging amplifier 640 may be implemented in the decoder circuit 600 of the digital-to-analog converter 1000, as mentioned in the example embodiment in FIG. 9. However, the averaging amplifier 640 may be included in the amplifying circuit 240 of FIG. 8, by implementing the amplifying circuit 240 with the function of the averaging amplifier 640.

FIG. 13 is a table illustrating operations of a mixed type digital-to-analog converter 1000 illustrated on FIG. 12.

Referring to FIG. 12 and FIG. 13, in case where digital data '0000000001' are input into the decoder circuit 600, the data value of the lower 3 bits, i.e. '001' is input into the first lower bit decoder 610 and the data value of the upper 3 bits, i.e. '0000000' is input into the NOR gate 652 of the first lower bit decoder output switching circuit 650.

Because the gamma reference voltage V1 is selected by the first lower bit decoder 610 and logic signal '1' is output from the NOR gate 652, the MOS transistors of the first lower bit decoder output switching circuit 650, i.e. M1, M2, M3 and M4 are turned on, thereby, four voltages V1 are transmitted into the averaging amplifier 640. Therefore, because all of the inputs of the averaging amplifier 640, i.e. X1, X2, X3, X4 are V1, the averaging amplifier 640 outputs the gamma reference voltage V1 as an output voltage Ya.

In case where digital data '0000000111' is input into the decoder circuit 600, the data value of the lower 3 bits, i.e. '111' is input into the first lower bit decoder 610 and the data value of the upper 3 bits, i.e. '0000000' is input into the NOR gate 652 of the first lower bit decoder output switching circuit 650.

Because the gamma reference voltages V7 is selected by the first lower bit decoder 610 and logic signal '1' is output from the NOR gate 652, the MOS transistors of the first lower bit decoder output switching circuit 650, i.e. M1, M2, M3 and M4 are turned on, thereby, four voltages V7 are transmitted into the averaging amplifier 640. Therefore, the averaging amplifier 640 outputs the gamma reference voltage V7.

In the previous example, the second lower bit decoder 620 also selects the gamma reference voltages V1017 or V1023 in response to '001' or '111'. However, because '0000000' is input into the AND gate 662 of the second lower bit decoder output switching circuit 660 and the AND gate 662 outputs logic signal '0', the MOS transistors of the second lower bit decoder output switching circuit 660, i.e. M11, M12, M13 and M14 are turned off, thereby, V1017 or V1023 is not input into the averaging amplifier 640. In addition, the quarter-type decoder 630 does not respond to the input signal.

In cases where digital data '0000001000' is input, the averaging amplifier 640 outputs average voltage V8, because V8, V8, V8, V8 are input into the averaging amplifier 640 through the quarter-type decoder 630 and all of the input voltages of the averaging amplifier 640, i.e. X1, X2, X3, X4 are V8. In addition, in case where digital data '0000001010' is input, V8, V8, V12, V12 are input into the averaging amplifier 640 through the quarter-type decoder 630, and the averaging amplifier 640 outputs an average voltage V10.

In case where digital data '1111111001' are input into the decoder circuit 600, the data value of the lower 3 bits, i.e. '001' is input into the second lower bit decoder 620 and the data value of the upper 3 bits, i.e. '1111111' is input into the AND gate 662 of the second lower bit decoder output switching circuit 660.

Because the gamma reference voltage V1016 is selected by the second lower bit decoder 620 and logic signal '1' is output from the AND gate 662, the MOS transistors of the second lower bit decoder output switching circuit 660, i.e. M11, M12, M13 and M14 are turned on, thereby, four V1016 voltages are transmitted into the averaging amplifier 640. Therefore, the averaging amplifier 640 outputs the gamma reference voltages V1016.

In case where digital data '1111111111' are input into the decoder circuit 600, the data value of the lower 3 bits, i.e. '111' is input into the second lower bit decoder 620 and the data value of the upper 3 bits, i.e. '1111111' is input into the AND gate 662 of the second lower bit decoder output switching circuit 660.

Because the gamma reference voltage V1023 is selected by the second lower bit decoder 620 and logic signal '1' is output from the AND gate 662, the MOS transistors of the second lower bit decoder output switching circuit 660, i.e. M11, M12, M13 and M14 are turned on, thereby, four V1023 voltages are transmitted into the averaging amplifier 640. Therefore, the averaging amplifier 640 outputs the gamma reference voltage V1023

The first lower bit decoder 610 also selects the gamma reference voltage V1 or V7 in response to '001' or '111'. However, because '1111111' is input into the NOR gate 652 of the first lower bit decoder output switching circuit 650 and the NOR gate 652 outputs logic signal '0', the MOS transistors of the first lower bit decoder output switching circuit 650, i.e. M1, M2, M3 and M4 are turned off, thereby, the voltages are not input into the averaging amplifier 640. In addition, in the case of the quarter-type decoder 630, the averaging amplifier 640 does not output an output voltage.

The gamma reference voltage V1016 has been output through the second full-type decoder 620 by the digital data '1111111001'. At the same time, V1016 may be used by the quarter-type decoder 630 together with V1012 so as to represent the gamma reference voltages V1013, V1014 and V1015. Therefore, the gamma reference voltage V1016 may be applied into both the second full-type decoder 620 and the quarter-type decoder 630. However, the quarter-type decoder 630 does not operate when the digital data '1111111001' are input.

As explained in other example embodiment in FIG. 12, a mixed type digital-to-analog converter 1000 having simplified circuit configuration has been explained. That is, the gamma reference voltages corresponding to the nonlinear interval (a, c) and the linear interval (b) of the gamma reference voltage have been decoded with full-type decoders a the quarter-type decoder, respectively. In addition, the part for decoding the upper 7 bits has been replaced by the NOR gate 652 and the AND gate 662, in the full-type decoder. As a result, the mixed type digital-to-analog converter 1000 may have simplified circuit configuration.

In the embodiments illustrated in FIG. 12, the output of the first lower bit decoder 610 and the second full-type decoder 620 may be switched through the source transistor array by inputting the value of the upper 7 bits of the digital data D9–D3.

Figure 14:
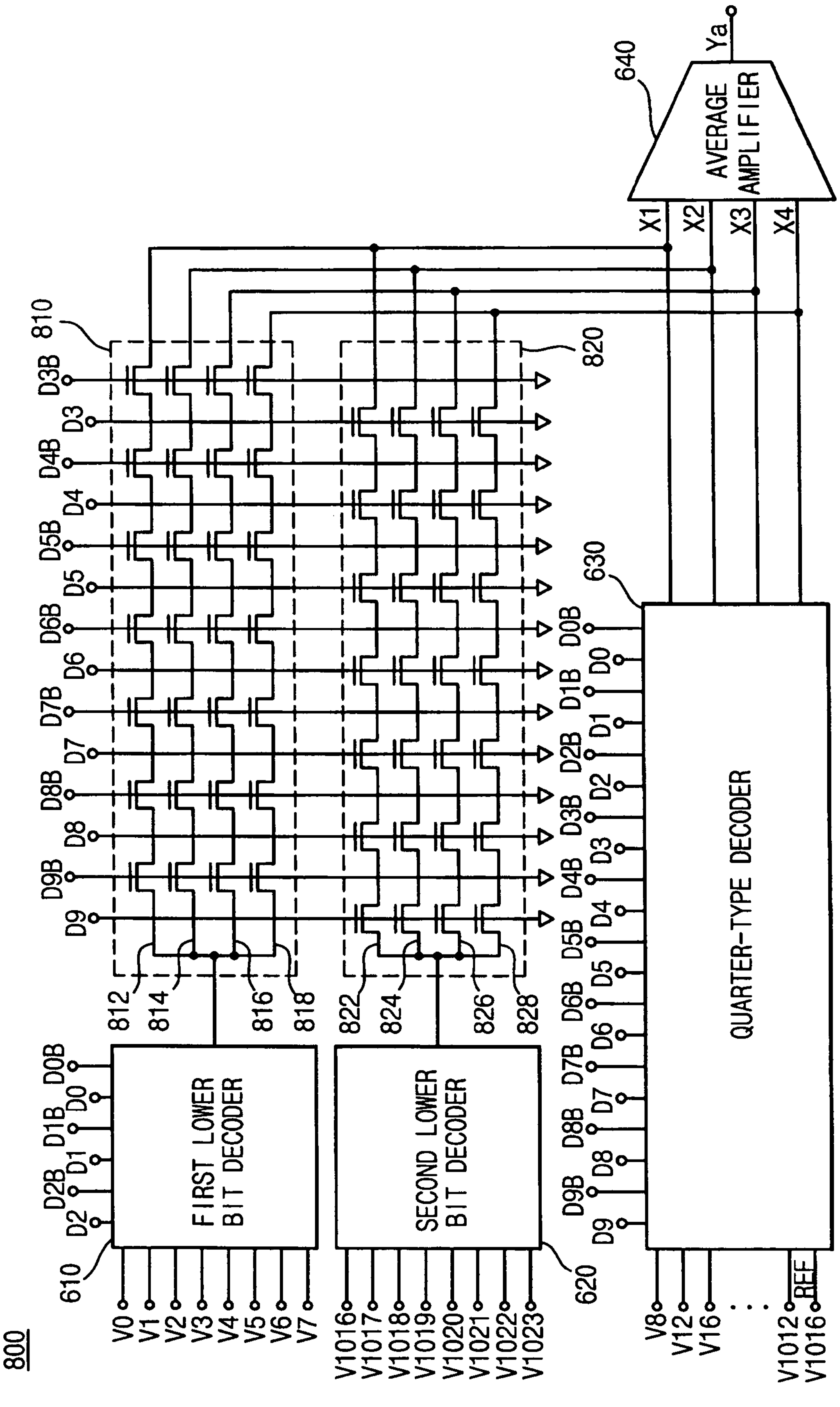
FIG. 14 is a circuit diagram illustrating a decoder circuit for a 10-bit digital-to-analog converter according to some embodiments of the present invention.

FIG. 14 is a circuit diagram illustrating a decoder circuit 800 of a mixed type digital-to-analog converter having 10-bit digital data, according to other example embodiment of the present invention.

As illustrated in FIG. 14, a configuration of a decoder circuit 800 of a mixed type digital-to-analog converter is similar to that of the decoder circuit 600 illustrated in FIG. 12. However, the first lower bit decoder output switching circuit 810 and the second lower bit decoder output switching circuit 820 are configured by MOS transistor arrays 812, 814, 816, 818, 822, 824, 826 and 828.

The first lower bit decoder output switching circuit 810 receives the upper seven bit values D9–D3 from among the digital data, and transmits output voltage output from the first lower bit decoder 610 to the averaging amplifier 640, or prevents the output voltage from being transmitted to the averaging amplifier 640 based on the upper seven bit values D9–D3.

The first lower bit decoder output switching circuit 810 transmits the output of the first lower bit decoder 610 into the averaging amplifier 640 only when the value of the upper seven bits D9–D3 is '0000000', and prevents the output voltage of the first lower bit decoder 610 from being transmitted to the averaging amplifier 640 when a different bit value is input, because the gamma reference voltages V0~V7 correspond to the first nonlinear interval (a) of the gamma reference voltages and all of the upper seven bits are '0'.

The first lower bit decoder output switching circuit 810 includes four MOS transistor arrays 812, 814, 816 and 818 which divide the output voltage from the first lower bit decoder 610 into four output voltages to transmit the four output voltages into the averaging amplifier 640 or prevent the four output voltages from being transmitted to the averaging amplifier 640. Each of the MOS transistor arrays 812, 814, 816 and 818 includes 7 MOS transistors connected in series, which receive the upper 7 bit values D9–D3 of the digital data or inverted values of each of the bit values through the gate respectively.

Each of the MOS transistors of the first lower bit decoder output switching circuit 810 receives inverted values of the upper 7 bit values, i.e. D9B, D8B, D7B, D6B, D5B, D4B and D3B, as illustrated in FIG. 14. Therefore, when the value of the upper seven bits D9–D3, i.e. '0000000' is input, because all of the inverted values, i.e. D9B, D8B, D7B, D6B, D5B, D4B and D3B are '1', all MOS transistors are turned on, and the outputs of the first lower bit decoder 610 are divided into four signals and the four signals are transmitted to the averaging amplifier 640.

The second lower bit decoder output switching circuit 820 receives the upper seven bit values D9–D3 from among the digital data, and transmits the voltage output from the second lower bit decoder 620 into the averaging amplifier 640, or prevents the output voltage from being transmitted to the averaging amplifier 640 based on the upper seven bit values D9–D3.

The second lower bit decoder output switching circuit 820 transmits output of the second lower bit decoder 620 into the averaging amplifier 640 only when the upper seven bit values D9–D3 are '1111111', and prevents output voltage of the second lower bit decoder 620 from being transmitted to the averaging amplifier 640 when a different bit value is input, because the gamma reference voltages, i.e. V1016~V1023 correspond to the second nonlinear interval (c) of the gamma reference voltages are and all the upper seven bits are '1'.

The second lower bit decoder output switching circuit 820 includes four MOS transistor arrays 822, 824, 826 and 828 which divide the output voltage from the second lower bit decoder 620 into four output voltages to transmit the four output voltages into the averaging amplifier 640 or prevents the four output voltages from being transmitted to the averaging amplifier 640. Each of the MOS transistor arrays 822, 824, 826 and 828 includes 7 MOS transistors connected in series, which receive the upper 7 bit values D9–D3 of the digital data, or inverted values of each of the bit values, through the gate of the 7 MOS transistors, respectively.

Each of the MOS transistors receives the upper 7 bit values, i.e. D9, D8, D7, D6, D5, D4 and D3, as illustrated in FIG. 14. Therefore, when the upper seven bits value, i.e. '1111111' is input, because all of the bit values, i.e. D9, D8, D7, D6, D5, D4 and D3 are '1', all MOS transistors are turned on, and the outputs of the second lower bit decoder 620 are divided into four signals and the four signals are transmitted to the averaging amplifier 640.

In this manner, in the first nonlinear interval (a) of the gamma curve, i.e. V0~V7, the reference voltages are selected by the first lower bit decoder 610, and in the linear interval (b), the gamma reference voltages are selected by the quarter-type decoder 630, and in the second nonlinear interval (c), i.e. V1016~V1023, the gamma reference voltages are selected by the second lower bit decoder 620.

The configuration of the first lower bit decoder output switching circuit 810 and the second lower bit decoder output switching circuit 820 may be changed when the first nonlinear interval (a) and the second nonlinear interval (c) correspond to different gray scales.

The case in which the first nonlinear interval (a) corresponds to V0~V7 and the case that the second nonlinear interval (c) corresponds to V1016~V1023 have been explained previously. However, when the first nonlinear interval (a) corresponds, for example, to V0~V15, one more decoder similar to the first lower bit decoder 610 may be additionally used to select the gamma reference voltages V8~V15, and one more output switching circuit similar to the first lower bit decoder output switching circuit 810 may be additionally used to switch the output of the decoder, and 'D3' would be input into the MOS transistors which receive 'D3B' through a gate thereof so as to transmit the output of the first lower bit decoder only when the upper seven bit values D9–D3 are '0000001'.

Similarly, according to the different establishment of the second nonlinear interval (c), one more decoder similar to the second lower bit decoder 620 and one more output switching circuit for switching the output of the decoder may be additionally used, and the bit values of the input data would be adjusted.

Having thus described some exemplary embodiments of the present invention, it is to be understood that the invention is not to be limited by particular details set forth in the above description as many apparent variations thereof are possible without departing from the spirit or scope thereof.

In particular, the gray scales corresponding to the nonlinear intervals (a, c) and the linear interval (b) of the gamma reference voltage may be changed. It is apparent that proper variations of the configuration of the corresponding circuit are possible, by decoding the gamma reference voltages with the full-type decoder in the nonlinear interval (a, c) and by decoding the gamma reference voltages with the quarter-type in the linear interval (b).

Although above exemplary embodiments discuss a source driver of the liquid crystal display device, the source driver of above exemplary embodiments could be utilized in organic electroluminescence devices.

By using a mixed type digital-to-analog converter according to some embodiments of the present invention, the size of the decoder, which is one of the dominant factors determining chip size, can be reduced, and a more accurate voltage can be output by decoding the gamma reference voltages corresponding to nonlinear intervals with a full-type decoder. In addition, a source driver having a mixed type digital-to-analog converter according to some embodiments of the invention can increase the number of bits to be decoded and/or can have a reduced chip size.

What is claimed is:

1. A digital-to-analog converter, comprising:

a full-type decoder configured to select one of a set of first gamma reference voltages based on an N-bit digital data, the set of first gamma reference voltages corresponding to a first interval of a plurality of gamma reference voltages; and a fractional decoder configured to receive a set of second gamma reference voltages corresponding to a second interval of the plurality of gamma reference voltages, and configured to generate a plurality of output voltages based on the N-bit digital data, each of the plurality of output voltages comprising one of a pair of adjacent gamma reference voltages in the set of second gamma reference voltages; and an averaging amplifier coupled to the fractional decoder and configured to output an average of the plurality of output voltages of the fractional decoder.

2. The DAC of claim 1, wherein the first interval comprises a nonlinear interval of the plurality of gamma reference voltages, and the second interval comprises a linear interval of the plurality of gamma reference voltages.

3. The digital-to-analog converter of claim 1, wherein N equals 10.

4. The digital-to-analog converter of claim 1, wherein the plurality of gamma reference voltages include 1024 levels for representing a 0th gray scale through a 1023rd gray scale.

5. The digital-to-analog converter of claim 4, wherein the first gamma reference voltages represent the 0th gray scale through the 7th gray scale.

6. The digital-to-analog converter of claim 4, wherein the second gamma reference voltages represent the 8th gray scale through the 1015th gray scale.

7. The digital-to-analog converter of claim 1, wherein the first gamma reference voltages represent a 0th gray scale through an (M×8−1)th gray scale.

8. The digital-to-analog converter of claim 7, wherein the second gamma reference voltages represent the (M×8)th gray scale through a (P×8−1)th gray scale.

9. The digital-to-analog converter of claim 1, further comprising:

a second full-type decoder configured to select one of a set of third gamma reference voltages based on the N-bit digital data, the set of third gamma reference voltages corresponding to a third interval of the plurality of gamma reference voltages, wherein the third interval comprises a nonlinear set of the plurality of gamma reference voltages.

10. The digital-to-analog converter of claim 9, wherein the third gamma reference voltages represent the 1016th gray scale through the 1023rd gray scale.

11. The digital-to-analog converter of claim 1, wherein the second set of gamma reference voltages are combinations of Vn and Vn+k, wherein Vn is one of the second set of gamma reference voltages and Vn+k is a gamma reference voltage which is k gray scale levels higher than Vn.

12. The digital-to-analog converter of claim 10, wherein k equals four and the average gamma reference voltage is one gamma reference voltage among Vn, Vn+1, Vn+2 and Vn+3, Vn+1 being 1 gray scale higher than Vn, Vn+2 being 2 gray scales higher than Vn, and Vn+3 being 3 gray scales higher than Vn.

13. The digital-to-analog converter of claim 1, wherein the full-type decoder and the fractional decoder receive each bit value of the N-bit digital data and an inverted value of each of the bit values.

14. The digital-to-analog converter of claim 1, further comprising a gamma reference voltage generating circuit coupled to the full-type decoder and the fractional decoder and configured to generate the plurality of gamma reference voltages for representing a plurality of gray scales.

15. A digital-to-analog converter, comprising:

a first lower bit decoder configured to select one of a plurality of first gamma reference voltages based on lower D bits of an N-bit digital data word, the plurality of first gamma reference voltages corresponding to a first nonlinear interval among a plurality of gamma reference voltages;

a second lower bit decoder configured to select one of a plurality of second gamma reference voltages based on the lower D bits of the N-bit digital data word, the plurality of second gamma reference voltages corresponding to a second nonlinear interval among the plurality of gamma reference voltages;

a quarter-type decoder configured to receive a plurality of third gamma reference voltages, and configured to select four of the plurality of third gamma reference voltages based on the N-bit digital data word, the plurality of third gamma reference voltages corresponding to a linear interval among the plurality of gamma reference voltages and respectively having a four gray scale level difference between adjacent ones of the plurality of third gamma reference voltages;

a first lower bit decoder output switching circuit configured to switch four fourth gamma reference voltages based on upper (N–D) bits of the N-bit digital data word, the selected first gamma reference voltage being divided into the four fourth gamma reference voltages by the first lower bit decoder output switching circuit;

a second lower bit decoder output switching circuit configured to switch four fifth gamma reference voltages based on upper (N–D) bits of the N-bit digital data word, the selected second gamma reference voltage being divided into the four fifth gamma reference voltages by the second lower bit decoder output switching circuit; and an averaging amplifier configured to output an average gamma reference voltage of the four third gamma reference voltages, or an average gamma reference voltage of the four fourth gamma reference voltages, or an average gamma reference voltage of the four fifth gamma reference voltages.

16. The digital-to-analog converter of claim 15, wherein N equals 10.

17. The digital-to-analog converter of claim 15, wherein D equals 3.

18. The digital-to-analog converter of claim 15, wherein the gamma reference voltages have 1024 levels for representing a 0th gray scale level through a 1023rd gray scale level.

19. The digital-to-analog converter of claim 15, wherein the first gamma reference voltages represent a 0th gray scale level through an (M×8−1)th gray scale level.

20. The digital-to-analog converter of claim 15, wherein the first gamma reference voltages represent a 0th gray scale level through a 7th gray scale level.

21. The digital-to-analog converter of claim 15, wherein the second gamma reference voltages represent (P×8)th gray scale level through a last gray scale level.

22. The digital-to-analog converter of claim 15, wherein the second gamma reference voltages represent a 1016th gray scale level through a 1023rd gray scale level.

23. The digital-to-analog converter of claim 15, wherein the third gamma reference voltages represent the 8th gray scale level through the 1015th gray scale level.

24. The digital-to-analog converter of claim 15, wherein the four third gamma reference voltages are combinations of Vn and Vn+4, wherein Vn is a gamma reference voltage among the plurality of third gamma reference voltages and Vn+4 is a gamma reference voltage which is 4 gray scale levels higher than Vn.

25. The digital-to-analog converter of claim 15, wherein the first lower bit decoder and the second lower bit decoder receive bit values of the lower D bits and inverted bit values of the lower D bits.

26. The digital-to-analog converter of claim 15, wherein the digital-to-analog converter further comprises a gamma reference voltage generating circuit configured to generate the plurality of gamma reference voltages for representing a plurality of gray scale levels.

27. The digital-to-analog converter of claim 15, wherein the first lower bit decoder includes a plurality of MOS transistor arrays configured to select one of the first gamma reference voltages, each of the MOS transistor arrays has D MOS transistors, and the number of the MOS transistor arrays corresponds to the number of the first gamma reference voltages.

28. The digital-to-analog converter of claim 27, wherein a bit value or an inverted bit value of one of the lower D bits input into a gate of each of the D MOS transistors in each of the MOS transistor arrays.

29. The digital-to-analog converter of claim 15, wherein the second lower bit decoder includes a plurality of MOS transistor arrays configured to select one of the second gamma reference voltages, each of the MOS transistor arrays has D MOS transistors, and the number of the MOS transistor arrays corresponds to the number of the second gamma reference voltages.

30. The digital-to-analog converter of claim 29, wherein a bit value or an inverted bit value of one of the lower D bits input into a gate of each of the D MOS transistors in each of the MOS transistor arrays.

31. The digital-to-analog converter of claim 15, wherein the first lower bit decoder output switching circuit includes a NOR gate and a first switching circuit, the NOR gate outputting logic signals based on the upper (N–D) bits, the first switching circuit dividing the selected first gamma reference voltage into the four fourth gamma reference voltages and switching the four fourth gamma reference voltages based on the logic signals from the NOR gate.

32. The digital-to-analog converter of claim 31, wherein the first switching circuit includes four MOS transistors, the first switching circuit dividing the selected first gamma reference voltage into the four fourth gamma reference voltages and transmitting the four fourth gamma reference voltages to the averaging amplifier, and the four MOS transistors receiving the logic signals from the NOR gate through gates of the four MOS transistors.

33. The digital-to-analog converter of claim 15, wherein the second lower bit decoder output switching circuit includes an AND gate and a second switching circuit, the AND gate outputting logic signals based on the upper (N–D) bits, the first switching circuit dividing the selected second gamma reference voltage into the four fifth gamma reference voltages and switching the four fifth gamma reference voltages based on the logic signals from the AND gate.

34. The digital-to-analog converter of claim 33, wherein the second switching circuit includes four MOS transistors, the second switching circuit dividing the selected second gamma reference voltage into the four fifth gamma reference voltages and transmitting the four fifth gamma reference voltages into the averaging amplifier, and the four MOS transistors receiving the logic signals from the AND gate through gates of the four MOS transistors.

35. The digital-to-analog converter of claim 15, wherein the first lower bit decoder output switching circuit includes four MOS transistor arrays that divide the selected first gamma reference voltage into the four fourth gamma reference voltages and switch the four fourth gamma reference voltages based on the upper (N–D) bits.

36. The digital-to-analog converter of claim 35, wherein each of the four MOS transistor arrays includes (N–D) MOS transistors coupled in series that receive bit values or inverted bit values of the upper (N–D) bits through respective gates of the (N–D) MOS transistors.

37. The digital-to-analog converter of claim 15, wherein the second lower bit decoder output switching circuit includes four MOS transistor arrays that divide the selected second gamma reference voltage into the four fifth gamma reference voltages and switch the four fifth gamma reference voltages based on the upper (N–D) bits.

38. The digital-to-analog converter of claim 37, wherein each of the four MOS transistor arrays includes (N–D) MOS transistors coupled in series that receive bit values or inverted bit values of the upper (N–D) bits through respective gates of the (N–D) MOS transistors.

39. A source driver of a display device, the source driver comprising:

a control circuit configured to generate a digital data word corresponding to a gray scale voltage level for a display panel; and a digital-to-analog converter coupled to the control circuit and configured to generate a plurality of gamma reference voltages for representing a plurality of gray scales, and configured to generate an analog gray scale voltage by decoding a gamma reference voltage corresponding to a nonlinear interval of the plurality of gamma reference voltages with a full-type decoder and by decoding a gamma reference voltage corresponding to a linear interval of the plurality of gamma reference voltages with a fractional decoder based on the digital data word generated by the control circuit.

* * * * *